United States Patent
Cheung

(10) Patent No.: US 7,907,078 B2
(45) Date of Patent: Mar. 15, 2011

(54) ANALOG-TO-DIGITAL CONVERTER AND ANALOG TO-DIGITAL CONVERSION METHOD

(75) Inventor: Tszshing Cheung, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/620,965

(22) Filed: Nov. 18, 2009

(65) Prior Publication Data
US 2010/0207799 A1    Aug. 19, 2010

(30) Foreign Application Priority Data

Feb. 16, 2009    (JP) .................. 2009-032346

(51) Int. Cl.
*H03M 1/34*    (2006.01)
(52) U.S. Cl. ...................... 341/162; 341/155
(58) Field of Classification Search .................. 341/155, 341/162, 161, 163
See application file for complete search history.

(56) References Cited

U.S. PATENT DOCUMENTS 5,194,865 A * 3/1993 Mason et al. .................. 341/132
7,561,083 B2 * 7/2009 Anderson et al. ............. 341/120

FOREIGN PATENT DOCUMENTS
JP      63-263921 A    10/1988

OTHER PUBLICATIONS

Behzad Razavi "Principles of Data Conversion System Design", 1995, 74.
Randall Geiger L. et al.,"VLSI Design Techniques for Analog and Digital Circuits", 1990, 619-630.

* cited by examiner

*Primary Examiner* — Peguy JeanPierre
(74) *Attorney, Agent, or Firm* — Fujitsu Patent Center

(57) ABSTRACT

An analog-to-digital converter is disclosed. An input signal processor sets a voltage of an input signal as an initial value of a signal voltage Vin, subtracts ½ⁿ of an input range from the nth (n is a positive integer) signal voltage based on a comparison result output from a comparator, and outputs the (n+1)th signal voltage. A reference voltage source outputs a reference voltage to be compared with the signal voltage output from the input signal processor, the reference voltage being obtained by repeatedly reducing by one half the input range. A comparator compares the signal voltage from the input signal processor with the reference voltage from the reference voltage source.

12 Claims, 23 Drawing Sheets

| THE PRESENT cmp | THE PREVIOUS Q: Q(k-1) | sw(k) |
|---|---|---|
| 0 | 0 | sw(k-1) |
| 0 | 1 | $\overline{sw(k-1)}$ |
| 1 | 0 | $\overline{sw(k-1)}$ |
| 1 | 1 | $\overline{sw(k-1)}$ |

FIG. 4

|  | A | B | C |
|---|---|---|---|
| DATA FORMAT | SERIAL (n BITS) | SERIAL (n BITS) | SERIAL (n BITS) |
| INPUT LOAD | OPERATIONAL AMPLIFIER + C | OPERATIONAL AMPLIFIER + C | OPERATIONAL AMPLIFIER + C |
| AREA | $(2^n+1)C$ | $8C + 2R + 2OP$ | $10C + 2R + 1OP$ |
| TIME CONSTANT | $Rs \cdot 2^n C$ | $Rs \cdot C$ | $Rs \cdot C$ |
| POWER CONSUMPTION | $Q(2^{n-1}C)V \cdot f + OPPw$ | $Q(8C)V \cdot f + 2OPPw$ | $Q(9C)V \cdot f + 2OPPw$ |

ANALOG-TO-DIGITAL CONVERTER AND ANALOG TO-DIGITAL CONVERSION METHOD

CROSS-REFERENCE TO RELATED APPLICATION(S)

This application is based upon and claims the benefit of priority of the prior Japanese Patent Application No. 2009-032346, filed on Feb. 16, 2009, the entire contents of which are incorporated herein by reference.

FIELD

The embodiments discussed herein are related to an analog-to-digital converter for digitally converting an analog input signal, and an analog-to-digital conversion method of the analog-to-digital converter.

BACKGROUND

An analog-to-digital converter (hereinafter referred to as an ADC) includes ADCs employing various conversion methods, such as successive approximation type ADCs (see, e.g., Japanese Laid-open Patent Publication No. 63-263921). In the successive approximation type ADCs, for example, an area of capacitors for generating a reference voltage exponentially increases according to the number of bits required for the A/D conversion.

This causes a problem that a circuit area of an ADC increases.

SUMMARY

According to an aspect of the present invention, there is provided an analog-to-digital converter for digitally converting an analog input signal. This analog-to-digital converter includes an input signal processor which sets a voltage of the input signal as an initial value of a signal voltage, subtracts $1/2^n$ of an input range from the nth (n is a positive integer) signal voltage based on a comparison result, and outputs the (n+1)th signal voltage; and a reference voltage source which outputs a reference voltage to be compared with the signal voltage output from the input signal processor, the reference voltage being obtained by repeatedly reducing by one half the input range.

The object and advantages of the invention will be realized and attained by unit of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIG. 4 illustrates a relationship among the present comparison result, the previous signal Q(k−1), and a signal state of a signal sw (k);

FIG. 20 illustrates a comparison among ADCs;

DESCRIPTION OF EMBODIMENT(S)

Figure 1:
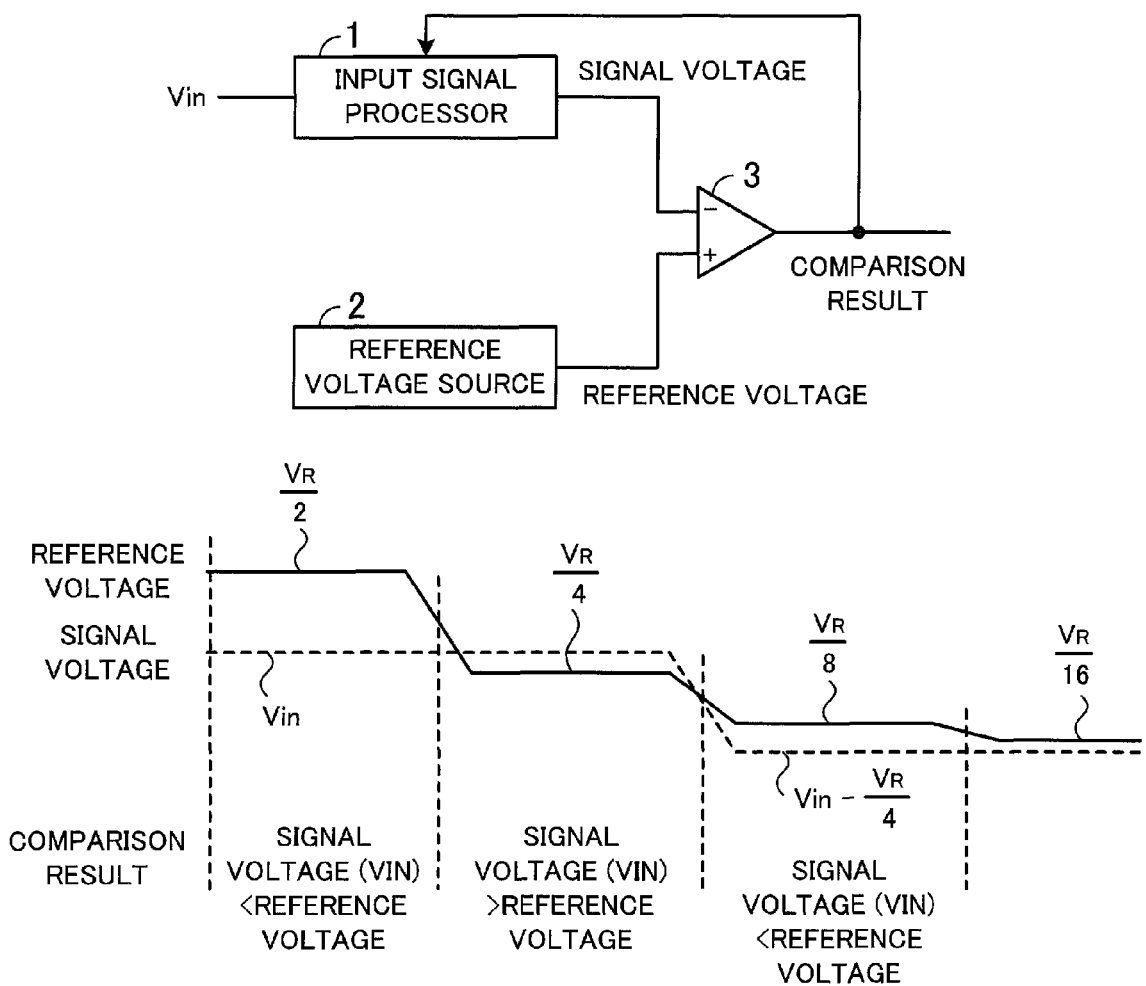
FIG. 1 illustrates an ADC according to the present invention.

FIG. 1 illustrates an ADC according to the present invention. As illustrated in FIG. 1, the ADC has an input signal processor 1, a reference voltage source 2, and a comparator 3. FIG. 1 also illustrates a relationship among a signal voltage from the input signal processor 1, a reference voltage from the reference voltage source 2, and a comparison result from the comparator 3.

The input signal processor 1 sets a voltage of an input signal Vin as an initial value of a signal voltage, subtracts $1/2^n$ of an input range $V_R$ from the n-th signal voltage (n is a positive integer) based on the comparison result from the comparator 3, and outputs the (n+1)th signal voltage. Specifically, when the comparator determines that a signal voltage is higher than a reference voltage, the input signal processor 1 subtracts $1/2^n$ of the input range $V_R$ from the nth signal voltage.

The reference voltage source 2 outputs a reference voltage to be compared with the signal voltage output from the input signal processor 1, the reference voltage being obtained by repeatedly reducing by one half the input range $V_R$.

The comparator 3 compares the signal voltage from the input signal processor 1 and the reference voltage from the reference voltage source 2. The comparison result from the comparator 3 serves as the basis for digital signals serially output from the ADC.

Operations of FIG. 1 will be described. The reference voltage source 2 outputs the reference voltages $V_R/2$, $V_R/4$, $V_R/8$, $V_R/16$, . . . obtained by repeatedly reducing by one half the input range $V_R$ as illustrated in FIG. 1.

The input signal processor 1 sets a voltage of the input signal Vin as an initial value, and outputs a signal voltage. The comparator 3 compares the signal voltage (Vin) from the input signal processor 1 with a reference voltage $V_R/2$. The comparison result is determined, for example, such that the signal voltage (Vin) is lower than the reference voltage $V_R/2$ as illustrated in FIG. 1.

The input signal processor 1 subtracts ½ of the input range $V_R$ from the first signal voltage based on the comparison result. The comparison result is determined such that the signal voltage (Vin) is lower than the reference voltage $V_R/2$ as described above. As a result, the input signal processor 1 outputs the signal voltage (Vin) without subtracting ½ of the input range $V_R$ from the first signal voltage.

The comparator 3 compares the signal voltage from the input signal processor 1 with the reference voltage $V_R/4$. The comparison result is determined, for example, such that the signal voltage (Vin) is higher than the reference voltage $V_R/4$ as illustrated in FIG. 1.

The input signal processor 1 subtracts ¼ of the input range $V_R$ from the second signal voltage based on the comparison result. The comparison result is determined such that the signal voltage (Vin) is higher than the reference voltage $V_R/4$ as described above. As a result, the input signal processor 1 outputs the signal voltage (Vin−$V_R/4$) obtained by subtracting ¼ of the input range $V_R$ from the second signal voltage (Vin). The same process is hereinafter repeated.

As described above, the ADC sets a voltage of an input signal Vin as an initial value of a signal voltage, subtracts $½^n$ of an input range $V_R$ from the n-th signal voltage based on the comparison result, and outputs the (n+1)th signal voltage. Further, the ADC outputs a reference voltage obtained by repeatedly reducing by one half the input range $V_R$ to be compared with the signal voltage output from the input signal processor 1.

Accordingly, the input signal processor 1 may include, for example, a capacitive element which holds the n-th signal voltage from which $½^n$ of the input range $V_R$ is subtracted based on the comparison result, and a capacitive element which holds the (n+1)th signal voltage. This makes it possible to suppress increase in the circuit area of the ADC. Meanwhile, the reference voltage source 2 may include, for example, an input capacitive element which holds a half of the input range $V_R$, and two voltage reducing elements which alternately hold the reference voltage and in which when one of the voltage reducing elements is connected to the input capacitive element, the other is discharged. This makes it possible to suppress increase in the circuit area of the ADC.

Next, a first embodiment will be described in detail with reference to the accompanying drawings.

Figure 2:
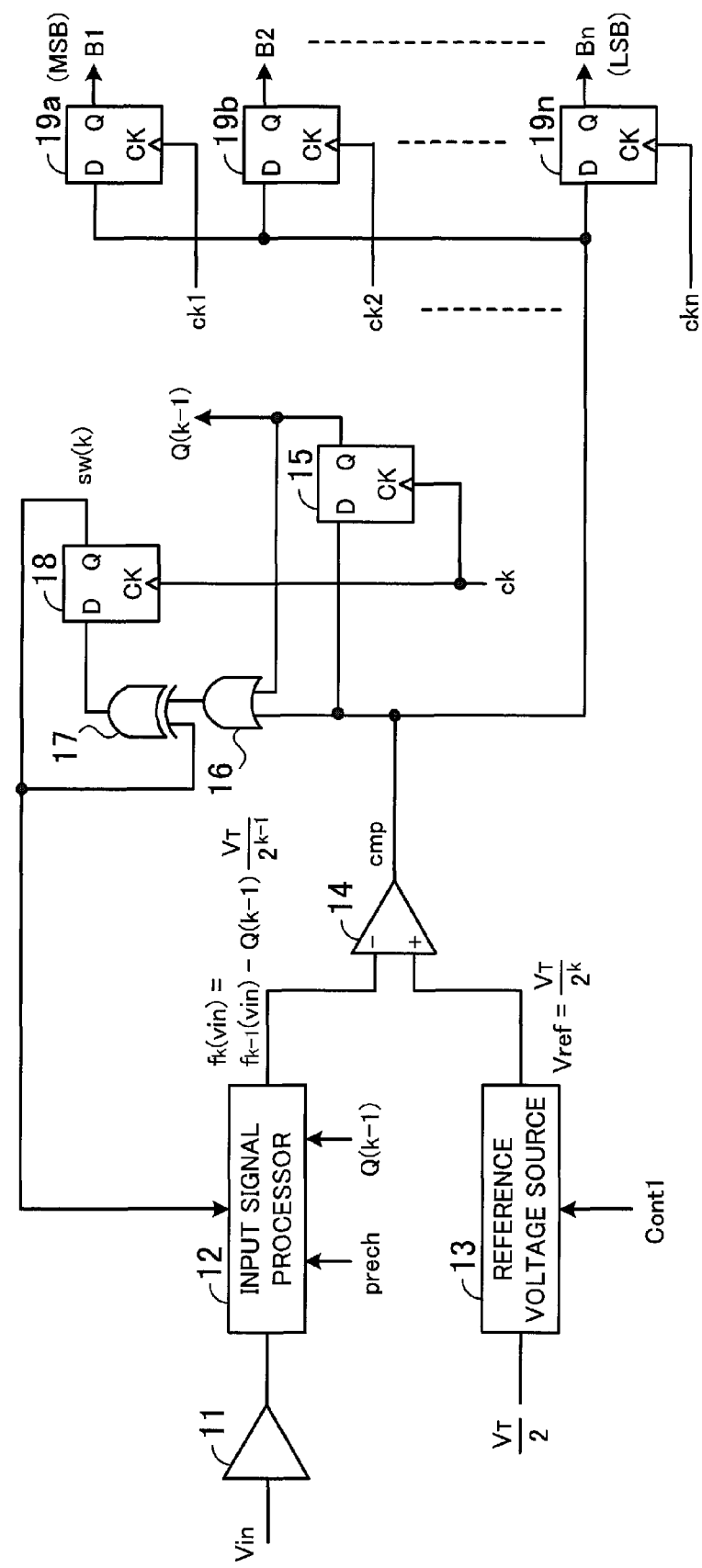
FIG. 2 is a block diagram of an ADC according to a first embodiment of the invention.

FIG. 2 is a block diagram of an ADC according to a first embodiment. As illustrated in FIG. 2, the ADC has an amplifier 11, an input signal processor 12, a reference voltage source 13, a comparator 14, D flip-flop circuits (hereinafter referred to as D-FF circuits) 15, 18, and 19a to 19n, an OR circuit 16, and an EXOR (EXclusive OR) circuit 17. The ADC illustrated in FIG. 2 is applied, for example, to transmitting-receiving circuits such as mobile devices and data transmission systems. The ADC illustrated in FIG. 2, for example, serially outputs a digitally converted signal.

The amplifier 11 receives an analog input signal Vin to be converted into a digital signal. The amplifier amplifies the input signal Vin, and supplies the amplified input signal Vin to the input signal processor 12.

The input signal processor 12 receives the input signal Vin output from the amplifier 11, a signal Q(k−1) output from the D-FF circuit 15, a signal sw(k) output from the D-FF circuit 18, and a precharge signal prech. The signals Q(k−1) and sw(k) take a logical value '0' or '1' based on the comparison result cmp from the comparator 14. The precharge signal prech is a signal for precharging the input signal Vin, and takes a logical value '0' or '1'.

The variable "k" takes values 1, 2, 3, . . . n.

The number "n" corresponds to the number of bits required to digitally convert the input signal Vin. For example, when the ADC illustrated in FIG. 2 is a 12-bit ADC, the variable "k" takes values 1, 2, . . . 12.

The input signal processor 12 performs arithmetic processing represented by the following formula (1).

$$f_k(vin) = f_{k-1}(vin) - Q(k-1) \cdot V_T/2^{k-1} \quad (1)$$

Here, the signal Q(k−1) changes while taking the same value as that of the comparison result cmp (takes a logical value '0' or '1') from the comparator 14, and changes while taking the same bit value as that of the digital signal output serially from the ADC beginning with the MSB. Suppose, for example, that the ADC outputs digital signals '1', '0', '1', '1', . . . serially beginning with the MSB (Most Significant Bit). In this case, signals Q(1), Q(2), Q(3), Q(4), . . . change as '1', '0', '1', '1', . . . . A signal Q(0) is '0'.

A voltage $f_0(vin)$ is the input signal Vin. A voltage $V_T$ is an input range of the input signal Vin. For example, when the input range of the input signal Vin is from 0 to 5 V, the voltage $V_T$ is 5 V.

In the case of k=1, (vin) and Q(k−1) in the formula (1) are modified to $f_0(vin)$ and Q(0), respectively.

The voltage $f_0(vin)$ and the signal Q(0) are the input signal Vin and '0', respectively, as described above. Accordingly, the formula (1) is modified to the following formula (2).

$$f_1(vin) = Vin \quad (2)$$

In the case of k=2, $f_{k-1}(vin)$, Q(k−1) and $V_T/2^{k-1}$ in the formula (1) are modified to $f_1(vin)$, Q(1), and $V_T/2$, respectively. The voltage $f_1(vin)$ is calculated by the formula (2), and the signal Q(1) is '1' based on the above-described serial output example of the ADC. Accordingly, the formula (1) is modified to the following formula (3).

$$f_2(vin) = Vin - V_T/2 \quad (3)$$

In the case of k=3, $f_{k-1}(vin)$, Q(k−1), and $V_T/2^{k-1}$ in the formula (1) are modified to $f_2(vin)$, Q(2), and $V_T/4$, respectively. The voltage $f_2(vin)$ is calculated by the formula (3), and the signal Q(2) is '0' based on the above-described serial output example of the ADC. Accordingly, the formula (1) is modified to the following formula (4).

$$f_3(vin) = f_2(vin) \quad (4)$$

In the case of k=4, $f_{k-1}(vin)$, Q(k−1), and $V_T/2^{k-1}$ in the formula (1) are modified to $f_3(vin)$, Q(3), and $V_T/8$, respectively. The voltage $f_3(vin)$ is calculated by the formula (4), and the signal Q(3) is '1' based on the above-described serial output example of the ADC. Therefore, the formula (1) is modified to the following formula (5).

$$f_4(vin) = f_3(vin) - V_T/8 \quad (5)$$

That is, the input signal processor 12 sets the input signal Vin as an initial value, and sequentially subtracts each of the voltages $V_T/2$, $V_T/4$, $V_T/8$, $V_T/16$ . . . from the previously calculated voltage based on the comparison result cmp (serially output bit values) from the comparator 14.

The reference voltage source 13 receives a voltage $V_T/2$ and a control signal Cont 1. The voltage $V_T$ is an input range of the input signal Vin as described above. The reference voltage source 13 supplies the reference voltage Vref of $V_T/2^k$ to the comparator 14 based on the control signal Cont 1. The reference voltage source 13 supplies the voltage $V_T/2$ to the comparator 14. Then, the reference voltage source 13 supplies the reference voltages Vref $V_T/4$, $V_T/8$, $V_T/16$ ... to the comparator 14 as the ADC outputs digital signals serially beginning with the MSB bit.

The comparator 14 compares the voltage $f_k(vin)$ supplied from the input signal processor 12 and the reference voltage Vref ($=V_T/2^k$) supplied from the reference voltage source 13. The comparator 14 outputs, for example, '1' when the voltage $f_k(vin)$ from the input signal processor 12 is higher than the voltage $V_T/2^k$ from the reference voltage source 13, and outputs '0' when the voltage $f_k(vin)$ from the input signal processor 12 is lower than the voltage $V_T/2^k$ from the reference voltage source 13. The comparison result cmp from the comparator 14 serves as the basis for digital signals serially output from the ADC.

The D-FF circuit 15 latches and outputs, in synchronization with a clock signal ck, the comparison result cmp supplied from the comparator 14. The D-FF circuit 15 supplies the latched comparison result cmp as the signal Q(k−1) to the input signal processor 12. The clock signal ck is an operation clock of the ADC, and the above-described variable k changes in synchronization with the clock signal ck.

The OR circuit 16 receives the comparison result cmp from the comparator 14 and the signal Q(k−1). The OR circuit 16 performs a logical OR operation between the comparison result cmp from the comparator 14 and the signal Q(k−1), and supplies the operation result to the EXOR circuit 17.

The EXOR circuit 17 receives the signal output from the OR circuit 16 and the signal sw(k) output from the D-FF circuit 18. The EXOR circuit 17 performs an EXOR operation between the signal from the OR circuit 16 and the signal sw(k) from the D-FF circuit 18, and supplies the operation result to the D-FF circuit 18.

The D-FF circuit 18 latches and outputs, in synchronization with the clock signal ck, the signal supplied from the EXOR circuit 17. The D-FF circuit 18 supplies the latched signal as the signal sw(k) to the input signal processor 12. The signal sw(k) from the D-FF circuit 18 outputs a logical value '0' or '1' based on the signal Q(k−1) and the comparison result cmp output from the comparator 14.

The D-FF circuits 19a, 19b, ..., 19n latch the comparison result cmp output from the comparator 14, and output the bits B1, B2, ..., Bn of a digital signal in synchronization with clock signals ck1, ck2, ..., ckn, respectively. The bit B1 is the MSB, and the bit Bn is the LSB (Least Significant Bit).

The clock signals ck1, ck2, ..., ckn are supplied to the D-FF circuits 19a, 19b, ..., 19n to cause the D-FF circuits 19a, 19b, ..., 19n to sequentially latch the comparison result cmp output from the comparator 14. The D-FF circuit 19a outputs the MSB bit B1, and the D-FF circuit 19b outputs the bit B2 that is the second bit from the MSB. Subsequent to similar outputting, the D-FF circuit 19n outputs the LSB bit Bn. In short, the D-FF circuits 19a to 19n output the bits B1 to Bn of a digital signal serially beginning with the MSB. When sequentially latching and simultaneously outputting the bits B1 to Bn of a digital signal output serially from the D-FF circuits 19a to 19n, the ADC can output the digital signal in parallel.

Figure 3:
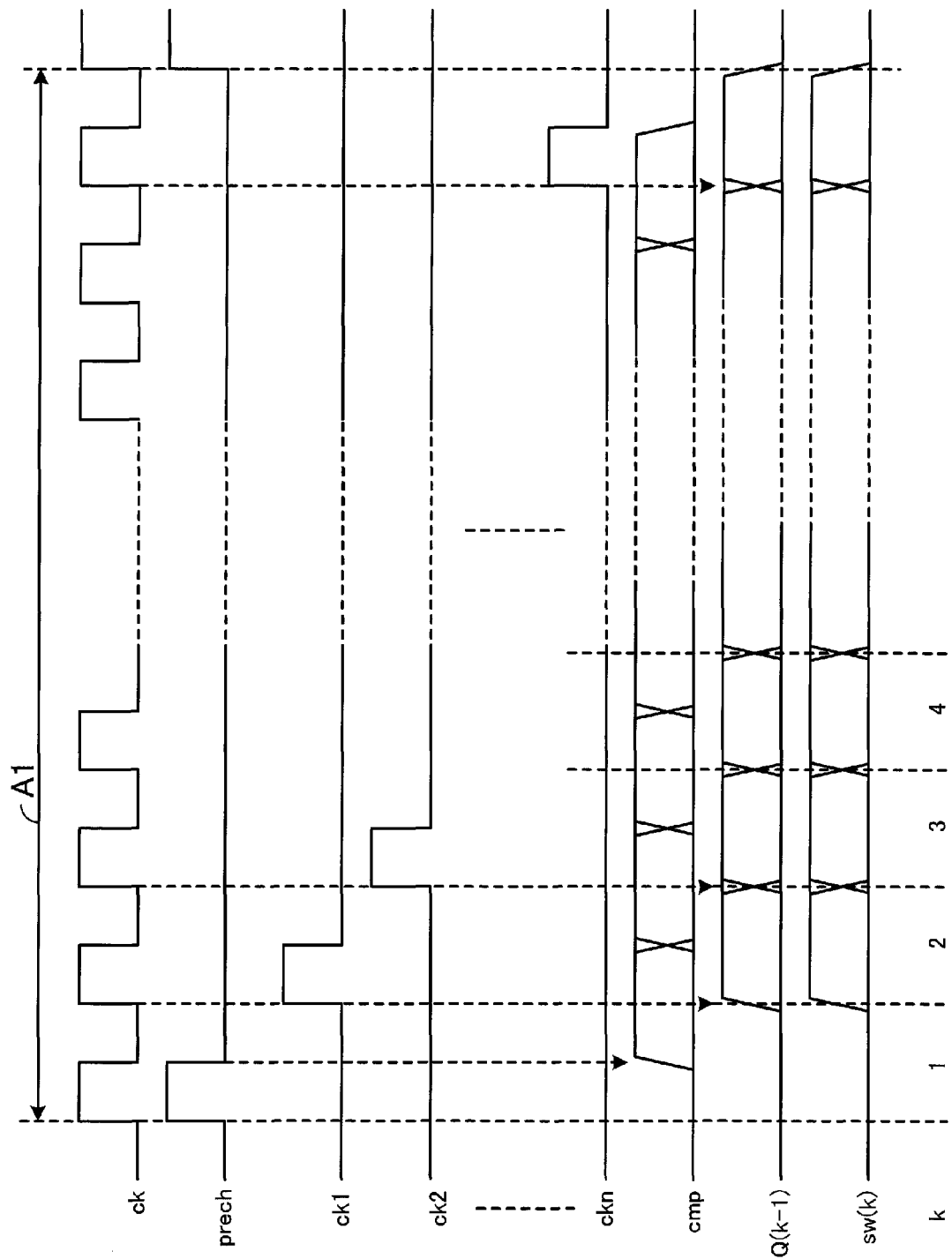
FIG. 3 is a timing chart of the ADC of FIG. 2.

FIG. 3 is a timing chart of the ADC of FIG. 2. FIG. 3 illustrates waveforms of the clock signal ck as the operation clock of the ADC, the precharge signal prech supplied to the input signal processor 12, the clock signals ck1 to ckn supplied to the D-FF circuits 19a to 19n, the comparison result cmp output from the comparator 14, the signal Q(k−1) output from the D-FF circuit 15, and the signal sw(k) output from the D-FF circuit 18. A bidirectional arrow of FIG. 3 indicates a cycle for converting the analog input signal Vin into a digital value.

As illustrated in FIG. 3, the precharge signal prech is supplied to the input signal processor 12 at the beginning of a cycle for converting an analog value into a digital value. The input signal processor 12 is precharged with the input signal Vin from the amplifier 11 by the precharge signal prech.

The input signal processor 12 performs, when being precharged with the input signal Vin, arithmetic processing represented by the formula (1), and supplies the processed voltage to the comparator 14. The comparator compares the voltage $f_k(vin)$ from the input signal processor 12 and the reference voltage Vref ($=V_T/2^k$) from the reference voltage source 13, and outputs the comparison result cmp as illustrated in FIG. 3.

The comparison result cmp is supplied to the D-FF circuits 19a to 19n. The clock signals ck1 to ckn as illustrated in FIG. 3 are supplied to the D-FF circuits 19a to 19n, respectively. Accordingly, the D-FF circuits 19a to 19n sequentially latch the comparison result cmp output from the comparator 14, in synchronization with the clock signals ck1 to ckn.

Further, the comparison result cmp is latched by the D-FF circuit 15, and output as the signal Q(k−1). The D-FF circuit 15 outputs the signal Q(k−1) in synchronization with the clock signal ck as illustrated in FIG. 3. The signal Q(k−1) changes while taking the same value as that of the comparison result cmp, and changes while taking the same values as those of the bits B1 to Bn of the digital signal output serially from the ADC beginning with the MSB.

The D-FF circuit 18 outputs the signal sw(k) in synchronization with the clock signal ck as illustrated in FIG. 3. The signal sw(k) is supplied to the input signal processor 12. The input signal processor 12 performs the arithmetic processing represented by the formula (1) based on the signal sw(k).

FIG. 4 illustrates a relationship among the present comparison result, the previous signal Q(k−1), and a signal state of the signal sw(k). The signal sw(k) outputs the previous signal state (signal sw(k−1)) as illustrated in FIG. 4. Note, however, that when the present comparison result cmp from the comparator 14 is '1', the signal sw(k) inverts the previous signal state, and outputs the inverted signal state. Further, when the present comparison result cmp from the comparator 14 is '0' and the previous signal Q(k−1) is '1', the signal sw(k) also inverts the previous signal state, and outputs the inverted signal state. The signal Q(k−1) is the comparison result cmp latched by the D-FF circuit 15. Accordingly, the previous signal Q(k−1) has the same value as that of the previous comparison result cmp.

Figure 5:
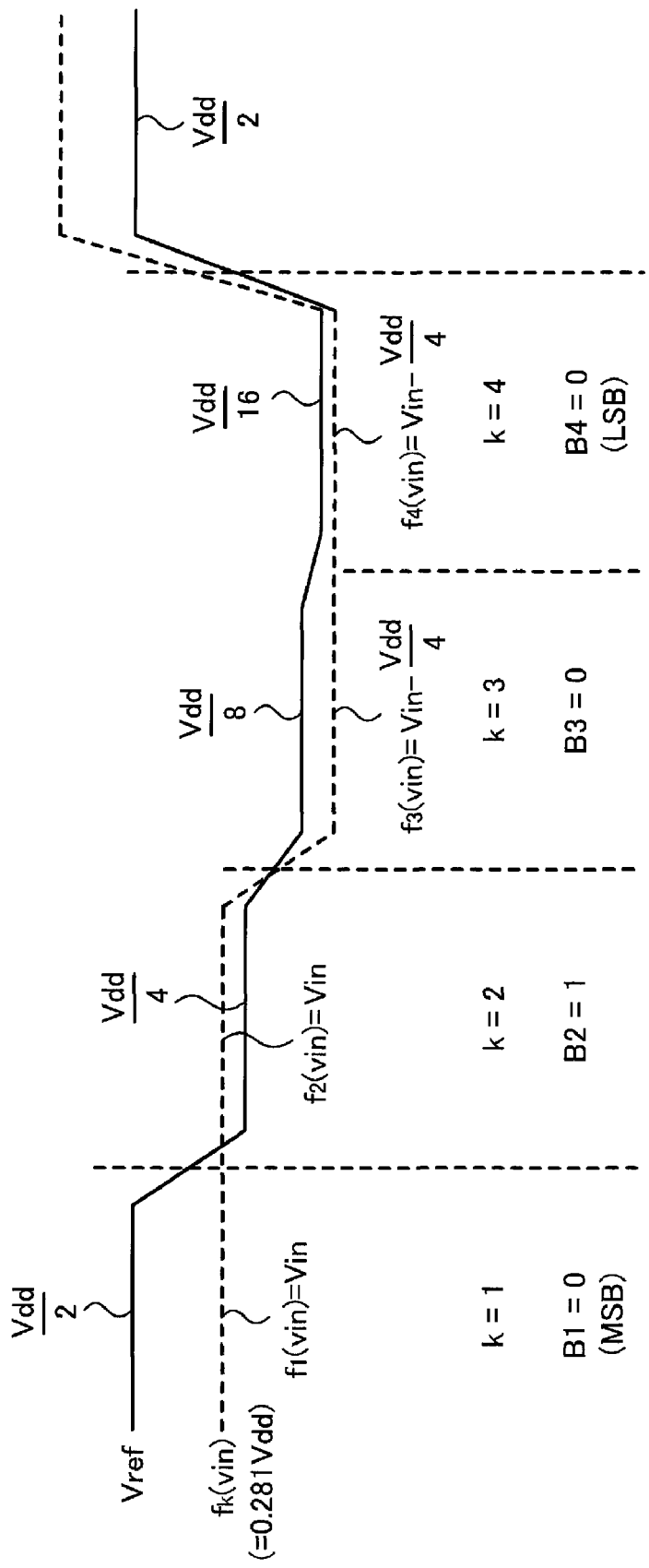
FIG. 5 is a first view for explaining operations of the ADC of FIG. 2.

FIG. 5 is a first view for explaining operations of the ADC of FIG. 2. FIG. 5 illustrates the voltage $f_k(vin)$ from the input signal processor 12 and the reference voltage Vref from the reference voltage source 13. Suppose that, in FIG. 5, the ADC converts an analog signal of 0.281 Vdd (Vdd: ADC supply voltage) into a 4-bit digital signal and the voltage $V_T$ is equal to the supply voltage Vdd. Accordingly, the variable k takes values 1, 2, 3, and 4, and the reference voltage Vref ($=V_T/2^k$) from the reference voltage source 13 changes as Vdd/2, Vdd/4, Vdd/8, and Vdd/16 as illustrated in FIG. 5.

The voltage $f_k(vin)$ from the input signal processor 12 changes as follows. In the case of k=1, $f_{k-1}(vin)$ and Q (k−1) in the formula (1) are modified to $f_0(vin)$ and Q(0), respectively. The voltage $f_0(vin)$ is the input signal Vin, and the input signal Vin is 0.281 Vdd. The signal Q(0) is '0'. Accordingly, the voltage $f_1$(vin) is represented by the following formula (6).

$$f_1(vin)=Vin=0.281Vdd \quad (6)$$

The voltage $f_1$(vin) in the formula (6) is compared with the reference voltage Vdd/2 by the comparator 14. Since $f_1$(vin)= 0.281 Vdd<Vdd/2, the comparison result '0' is output from the comparator 14. The comparison result '0' from the comparator 14 is latched by the D-FF circuit 19a, and output as the bit B1 (MSB) of the digital signal.

In the case of k=2, $f_{k-1}$(vin), Q(k−1) and $V_T/2^{k-1}$ in the formula (1) are modified to $f_1$(vin), Q(1) and $V_T/2$, respectively. The voltage $f_1$(vin) is 0.281 Vdd from the formula (6). The signal Q(1) is '0' from the bit B1=0. Accordingly, the voltage $f_2$(vin) is represented by the following formula (7).

$$f_2(vin)=0.281Vdd \quad (7)$$

The voltage $f_2$(vin) in the formula (7) is compared with the reference voltage Vdd/4 by the comparator 14. Since $f_2$(vin) =0.281 Vdd>Vdd/4, the comparison result '1' is output from the comparator 14. The comparison result '1' from the comparator 14 is latched by the D-FF circuit 19b, and output as the bit B2 of the digital signal.

In the case of k=3, $f_{k-1}$(vin), Q(k−1), and $V_T/2^{k-1}$ in the formula (1) are modified to $f_2$(vin), Q(2), and $V_T/4$, respectively. The voltage $f_2$(vin) is 0.281 Vdd from the formula (7). The signal Q(2) is '1' from the bit B2=1. Accordingly, the voltage $f_3$(vin) is represented by the following formula (8).

$$f_3(vin)=0.281Vdd-Vdd/4 \quad (8)$$

The voltage $f_3$(vin) in the formula (8) is compared with the reference voltage Vdd/8 by the comparator 14. Since $f_3$(vin)= 0.031 Vdd<Vdd/8, the comparison result '0' is output from the comparator 14. The comparison result '0' from the comparator 14 is latched by the D-FF circuit 19c, and output as the bit B3 of the digital signal.

In the case of k=4, $f_{k-1}$(vin), Q(k−1), and $V_T/2^{k-1}$ in the formula (1) are modified to $f_3$(vin), Q(3), and $V_T/8$, respectively. The voltage $f_3$(vin) is calculated by the formula (8). The signal Q(3) is '0' from the bit B3=0. Accordingly, the voltage $f_4$(vin) is represented by the following formula (9).

$$f_4(vin)=f_3(vin)=0.281Vdd-Vdd/4 \quad (9)$$

The voltage $f_4$(vin) in the formula (9) is compared with the reference voltage Vdd/16 by the comparator 14. Since $f_4$(vin)= 0.031 Vdd<Vdd/16, the comparison result '0' is output from the comparator 14. The comparison result '0' from the comparator 14 is latched by the D-FF circuit 19d, and output as the bit B4 of the digital signal.

Thus, the ADC outputs a digital signal '0100' beginning with the MSB. When the digital value '0100' is converted into an analog value, an analog value of 4 Vdd/16=0.25 Vdd is obtained.

Figure 6:
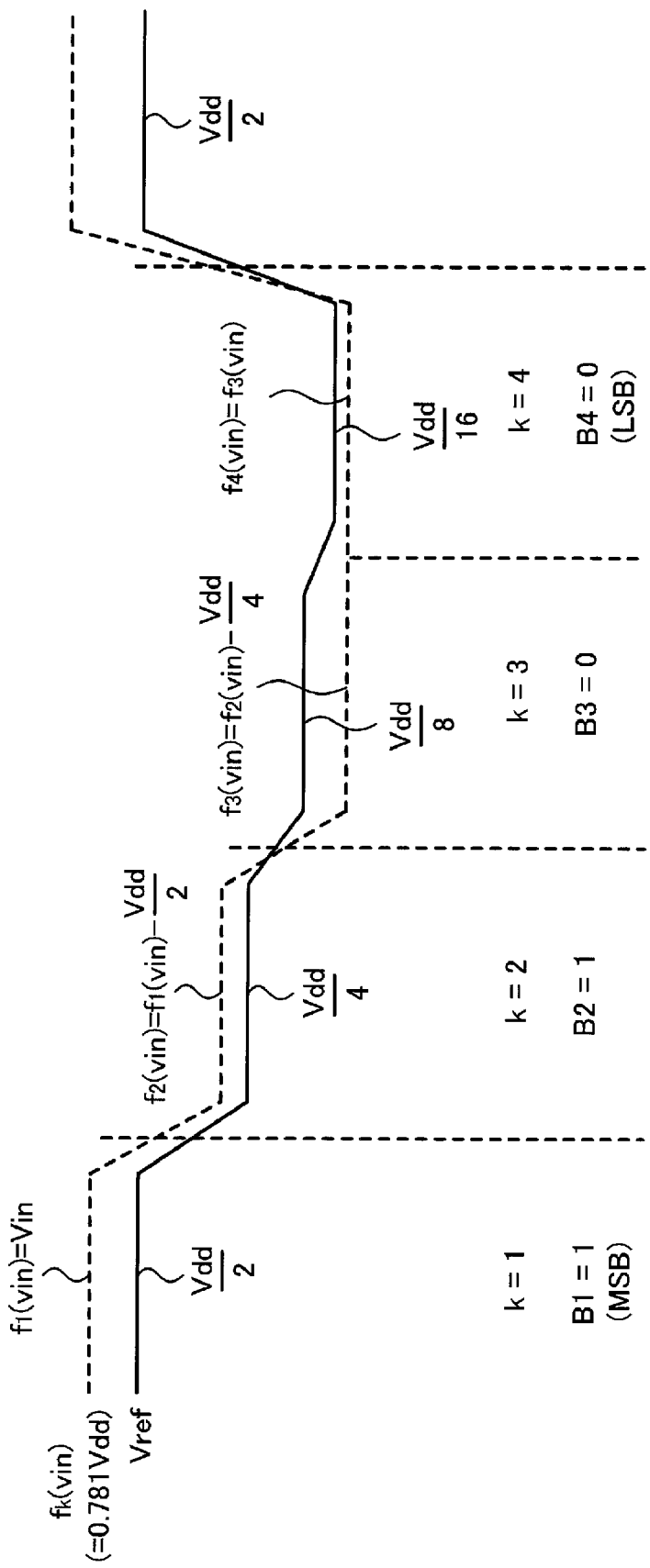
FIG. 6 is a second view for explaining operations of the ADC of FIG. 2.

FIG. 6 is a second view for explaining operations of the ADC of FIG. 2. FIG. 6 illustrates the voltage $f_k$(vin) from the input signal processor 12 and the reference voltage Vref from the reference voltage source 13. Suppose that, in FIG. 6, the ADC converts an analog signal of 0.781 Vdd into a 4-bit digital signal and the voltage $V_T$ is equal to the supply voltage Vdd. Accordingly, the variable k takes values 1, 2, 3, and 4, and the reference voltage Vref (=$V_T/2^k$) from the reference voltage source 13 changes as Vdd/2, Vdd/4, Vdd/8, and Vdd/ 16 as illustrated in FIG. 6.

The voltage $f_k$(vin) from the input signal processor 12 changes as follows. In the case of k=1, $f_{k-1}$(vin) and Q (k−1) in the formula (1) are modified to $f_0$(vin) and Q(0), respectively. The voltage $f_0$(vin) is the input signal Vin, and the input signal Vin is 0.781 Vdd. The signal Q(0) is '0'. Accordingly, the voltage $f_1$(vin) is represented by the following formula (10).

$$f_1(vin)=Vin=0.781Vdd \quad (10)$$

The voltage $f_1$(vin) in the formula (10) is compared with the reference voltage Vdd/2 by the comparator 14. Since $f_1$(vin)=0.781 Vdd>Vdd/2, the comparison result '1' is output from the comparator 14. The comparison result '1' from the comparator 14 is latched by the D-FF circuit 19a, and output as the bit B1 (MSB) of the digital signal.

In the case of k=2, $f_{k-1}$(vin), Q(k−1), and $V_T/2^{k-1}$ in the formula (1) are modified to $f_1$(vin), Q(1), and $V_T/2$, respectively. The voltage $f_1$(vin) is 0.781 Vdd from the formula (10). The signal Q(1) is '1' from the bit B1=1. Accordingly, the voltage $f_2$(vin) is represented by the following formula (11).

$$f_2(vin)=f_1(vin)-Vdd/2 \quad (11)$$

The voltage $f_2$(vin) in the formula (11) is compared with the reference voltage Vdd/4 by the comparator 14. Since $f_2$(vin)=0.281 Vdd>$V_T/4$, the comparison result '1' is output from the comparator 14. The comparison result '1' from the comparator 14 is latched by the D-FF circuit 19b, and output as the bit B2 of the digital signal.

In the case of k=3, $f_{k-1}$(vin), Q(k−1), and $V_T/2^{k-1}$ in the formula (1) are modified to $f_2$(vin), Q(2), and $V_T/4$, respectively. The voltage $f_2$(vin) is calculated from the formula (11). The signal Q(2) is '1' from the bit B2=1. Accordingly, the voltage $f_3$(vin) is represented by the following formula (12).

$$f_3(vin)=f_2(vin)-Vdd/4 \quad (12)$$

The voltage $f_3$(vin) in the formula (12) is compared with the reference voltage Vdd/8 by the comparator 14. Since $f_2$(vin)=0.031 Vdd<Vdd/8, the comparison result '0' is output from the comparator 14. The comparison result '0' from the comparator 14 is latched by the D-FF circuit 19c, and output as the bit B3 of the digital signal.

In the case of k=4, $f_{k-1}$(vin), Q(k−1), and $V_T/2^{k-1}$ in the formula (1) are modified to $f_2$(vin), Q(3), and $V_T/8$, respectively. The voltage $f_3$(vin) is calculated from the formula (12). The signal Q(3) is '0' from the bit B3=0. Accordingly, the voltage $f_4$(vin) is represented by the following formula (13).

$$f_4(vin)=f_2(vin) \quad (13)$$

The voltage $f_4$(vin) in the formula (13) is compared with the reference voltage Vdd/16 by the comparator 14. Since $f_4$(vin)=0.031 Vdd<$V_T/16$, the comparison result '0' is output from the comparator 14. The comparison result '0' from the comparator 14 is latched by the D-FF circuit 19d, and output as the bit B4 of the digital signal.

Thus, the ADC outputs a digital signal '1100' beginning with the MSB. When the digital value '0101' is converted into an analog value, an analog value of 5Vdd/16=0.75 Vdd is obtained.

As described above, the ADC reduces by ½ the reference voltage to be compared with the input signal Vin. Further, the ADC sets the input signal Vin as an initial value, and sequentially subtracts each of the voltages $V_T/2$, $V_T/4$, $V_T/8$ . . . from the previously calculated voltage based on the output bit values (the comparison result from the comparator 14). This processing enables the ADC to reduce the number of capacitors to be mounted.

Figure 7:
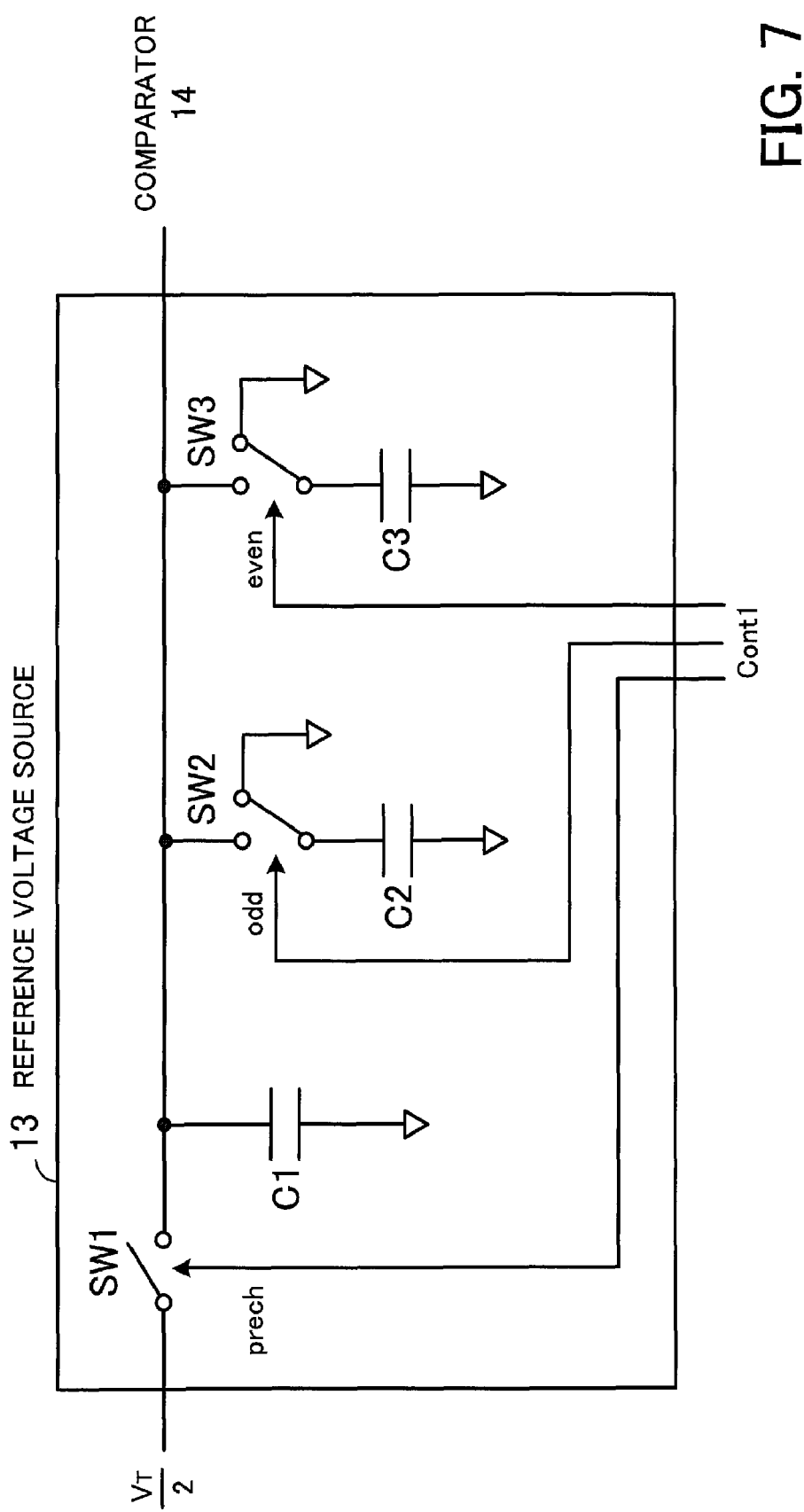
FIG. 7 is a circuit diagram of a reference voltage source of FIG. 2.

FIG. 7 is a circuit diagram of the reference voltage source 13 of FIG. 2. As illustrated in FIG. 7, the reference voltage source 13 has switches SW1 to SW3 and capacitors C1 to C3. The capacitors C1 to C3 have the same capacitance value. A control signal Cont 1 has a precharge signal and switching signals odd and even.

The switch SW1 is turned on/off by the precharge signal prech. This precharge signal prech is the same as that supplied to the input signal processor 12, and supplied to the reference voltage source 13 before analog signals are converted into digital signals.

When the switch SW1 is turned on, the capacitor C1 is precharged with the voltage $V_T/2$. When the capacitor C1 is precharged with the voltage $V_T/2$, the switches SW2 and SW3 connect each one end of the capacitors C2 and C3 to the ground, respectively. That is, the voltage $V_T/2$ is precharged in the capacitor C1.

The switch SW1 is turned off when the voltage $V_T/2$ is precharged in the capacitor C1. The voltage $V_T/2$ precharged in the capacitor C1 is supplied to the comparator 14.

When the ADC outputs the bit B1 as the MSB, the switching signal odd switches the switch SW2 so as to connect one end of the capacitor C2 to the capacitor C1. As a result, a charge of the capacitor C1 is transferred to the capacitor C2, and each voltage of the capacitors C1 and C2 is reduced to a voltage $V_T/4$. This voltage $V_T/4$ is supplied to the comparator 14.

Subsequently, the switching signal odd connects the switch SW2 to the ground to discharge the capacitor C2, whereas the switching signal even switches the switch SW3 so as to connect one end of the capacitor C3 to the capacitor C1. As a result, a charge of the capacitor C1 is transferred to the capacitor C3, and each voltage of the capacitors C1 and C3 is reduced to the voltage $V_T/8$. This voltage $V_T/8$ is supplied to the comparator 14.

Subsequently, the switching signal even connects the switch SW3 to the ground to discharge the capacitor C3. The switching signal odd switches the switch SW2 so as to connect one end of the capacitor C2 to the capacitor C1. As a result, a charge of the capacitor c1 is transferred to the capacitor C2, and each voltage of the capacitors C1 and C2 is reduced to the voltage $V_T/16$. This voltage $V_T/16$ is supplied to the comparator 14.

As described above, the connection of the capacitor C2 to the ground and the capacitor C1 and the connection of the capacitor C3 to the ground and the capacitor C1 are switched by the signals odd and even, respectively. This enables the reference voltage source 13 to generate the voltage $V_T/2^{k-1}$.

Figure 8:
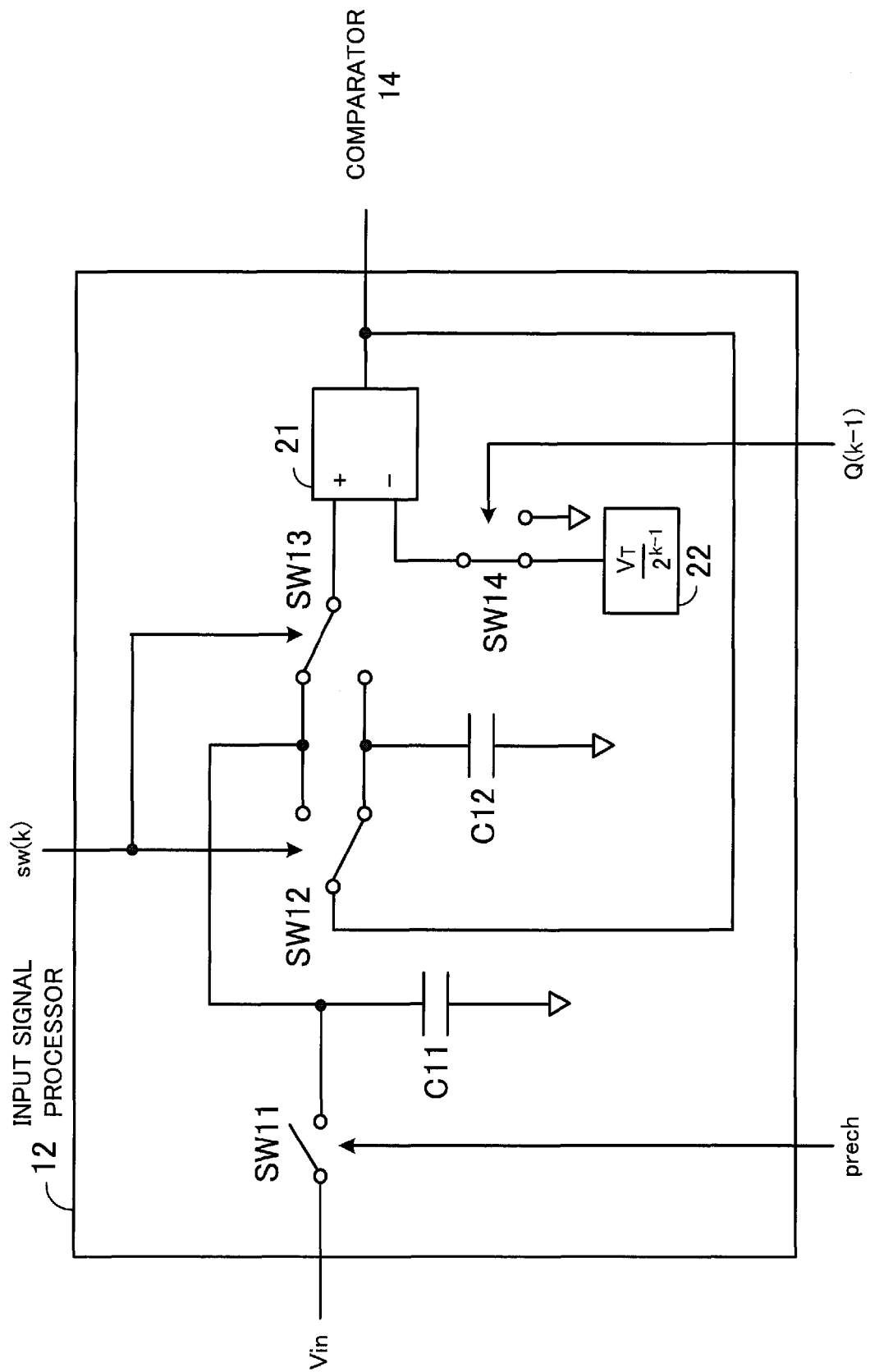
FIG. 8 is a circuit diagram of an input signal processor of FIG. 2.

FIG. 8 is a circuit diagram of the input signal processor 12 of FIG. 2. As illustrated in FIG. 8, the input signal processor 12 has switches SW11 to SW14, capacitors C11 and C12, a voltage generating circuit 22, and a subtractor 21. The capacitors C11 and C12 have the same capacitance value.

The switch SW11 is turned on/off by the precharge signal prech. The precharge signal prech is supplied to the input signal processor 12 before analog signals are converted into digital signals. The capacitor C11 is precharged with the input signal Vin from the amplifier 11 when the switch SW11 is turned on.

The switch SW12 connects the output of the subtractor 21 to the capacitor C11 or C12 based on the signal sw(k). The switch SW13 connects the input of the subtractor 21 to the capacitor C11 or C12 based on the signal sw(k).

The switches SW12 and 13 connect one of the capacitors C11 and C12 to the input of the subtractor 21, and connect the other capacitor C11 or C12 to the output of the subtractor 21.

That is, the switches SW 12 and SW 13 are arranged such that when the subtractor 21 subtracts a voltage of the voltage generating circuit 22 from a voltage of one of the capacitors C11 and C12, an output voltage (subtraction result) of the subtractor 21 is held in the other capacitor C11 or C12. For example, in the state of the switches SW12 and Sw13 illustrated in FIG. 8, the subtractor 21 subtracts the voltage of the voltage generating circuit 22 from the voltage of the capacitor C11, and the output voltage of the subtractor 21 is held in the capacitor C12.

The subtractor 21 receives a voltage of one of the capacitors C11 and C12 and a voltage of the voltage generating circuit 22. The subtractor 21 subtracts the voltage of the voltage generating circuit 22 from the voltage of one of the capacitors C11 and C12, and supplies the resulting voltage to the comparator 14.

The voltage generating circuit 22 has the same circuit as that of the reference voltage source 13 illustrated in FIG. 7, and generates a voltage $V_T/2^{k-1}$. The switch SW14 is turned on/off based on the signal Q(k−1). When the signal Q(k−1) is '1', the switch SW14 connects the voltage generating circuit 22 and the subtractor 21 (hereinafter referred to as ON), whereas when the signal Q(k−1) is '0', the switch SW14 connects the input of the subtractor 21 to the ground (hereinafter referred to as OFF).

That is, the input signal processor 12 of FIG. 2 sets as an initial value the input signal Vin precharged in the capacitor C11, and sequentially subtracts each of the voltages $V_T/2$, $V_T/4$, $V_T/8$, . . . from the previous subtraction result held in the capacitor C11 or C12 based on the serially output bit values (the comparison result from the comparator 14).

Hereinafter, operations of the input signal processor 12 of FIG. 8 will be described. Suppose that when the signal sw(k) is '0', the input of the subtractor 21 is connected to the capacitor C11 and the output of the subtractor 21 is connected to the capacitor C12, whereas when the signal sw(k) is '1', the input of the subtractor 21 is connected to the capacitor C12 and the output of the subtractor 21 is connected to the capacitor C11. A signal sw(1) is '0' to supply the voltage precharged in the capacitor C11 to the subtractor 21.

The signal state of the signal sw(k) changes as illustrated in FIG. 4. That is, when the present comparison result cmp from the comparator 14 is '1', the signal sw(k) inverts the previous signal state, and outputs the inverted signal state. As a result, connections are switched between the capacitors C11 and C12 connected to the input and output of the subtractor 21. More specially, when the present comparison result cmp is '1', connections are switched between the capacitors C11 and C12 to subtract the voltage $V_T/2^k$ from the previous voltage $f_{k-1}(vin)$ and to hold the resulting voltage in the capacitor C11 or C12 different from the capacitor that holds the previous voltage $f_{k-1}(vin)$. Even when the present comparison result cmp from the comparator 14 is '0', when the previous comparison result cmp is '1', the signal sw(k) inverts the previous signal state, and outputs the inverted signal state. As a result, connections are switched between the capacitors C11 and C12 connected to the input and output of the subtractor 21. More specifically, in this case, connections are switched between the capacitors C11 and C12 to output the voltage $f_k(vin)$ from the capacitor C11 or C12 that holds the previous voltage $f_{k-1}(vin)$. When both of the present and previous comparison results cmp are '0', connections are not switched between the capacitors C11 and C12. This makes it possible to reduce power consumption due to charge and discharge of the capacitors C11 and C12.

For example, in the case of k=1, the signal sw(1) has a signal state '0' from the above description. Accordingly, the input signal Vin precharged in the capacitor C11 is supplied to the subtractor 21. Further, the signal Q(0) is '0'. Accordingly, the switch SW14 is turned off, and the subtractor 21 outputs the input signal Vin.

The output voltage (Vin) of the subtractor 21 is held in the capacitor C12. The output voltage of the subtractor 21 is compared with the reference voltage Vref=$V_T/2$ by the comparator 14. Hereinafter, operations of the input signal processor 12 of FIG. 8 will be described with reference to the example of FIG. 5. Suppose that the input signal Vin is equal to 0.281 Vdd. Accordingly, the output voltage (0.281 Vdd) of the subtractor 21 is compared with the reference voltage Vref=Vdd/2 by the comparator 14, and the comparison result '0' (bit B1=0) is output from the comparator 14.

In the case of k=2, the present comparison result from the comparator 14 is '0', and the previous comparison result is '0' (the initial value '0'). Accordingly, the signal sw(2) holds the previous signal state '0', and outputs the signal state '0'. Therefore, the input signal Vin held in the capacitor C11 is supplied to the subtractor 21. Further, the signal Q(1) is '0' from the bit B1=0. Accordingly, the switch SW 14 is turned off, and the subtractor 21 outputs the input signal Vin.

The output voltage (Vin) of the subtractor 21 is held in the capacitor C12. The output voltage (Vin=0.281Vdd) of the subtractor 21 is compared with the reference voltage Vref=Vdd/4 by the comparator 14, and the comparison result '1' (the bit B2=1) is output from the comparator 14.

In the case of k=3, the present comparison result from the comparator 14 is '1', and the previous comparison result is '0'. Accordingly, the signal sw(3) inverts the previous signal state '0' and outputs the signal state '1'. Therefore, the voltage (Vin) held in the capacitor C12 is supplied to the subtractor 21. Further, the signal Q(2) is '1' from the bit B2=1. Accordingly, the switch SW14 is turned on, and the subtractor 21 outputs Vin-Vdd/4.

The output voltage (0.281Vdd-Vdd/4) of the subtractor 21 is held in the capacitor C11. Further, the output voltage (0.281 Vdd-Vdd/4) of the subtractor 21 is compared with the reference voltage Vref=Vdd/8 by the comparator 14, and the comparison result '0' (the bit B3=0) is output from the comparator 14.

In the case of k=4, the present comparison result from the comparator 14 is '0', and the previous comparison result is '1'. Accordingly, the signal sw(4) inverts the previous signal state '1' and outputs the signal state '0'. Therefore, the voltage (Vin-Vdd/4) held in the capacitor C11 is supplied to the subtractor 21. Further, the signal Q(3) is '0' from the bit B3=0. Accordingly, the switch SW14 is turned off, and the subtractor 21 outputs Vin-Vdd/4.

The output voltage (0.281Vdd-Vdd/4) of the subtractor 21 is held in the capacitor C12. Further, the output voltage (0.281 Vdd-Vdd/4) of the subtractor 21 is compared with the reference voltage Vref=Vdd/16 by the comparator 14, and the comparison result '0' (the bit B4=0) is output.

Thus, the ADC provides the serial output '0100'. The same concept can also be applied to the example of FIG. 6.

Figure 9:
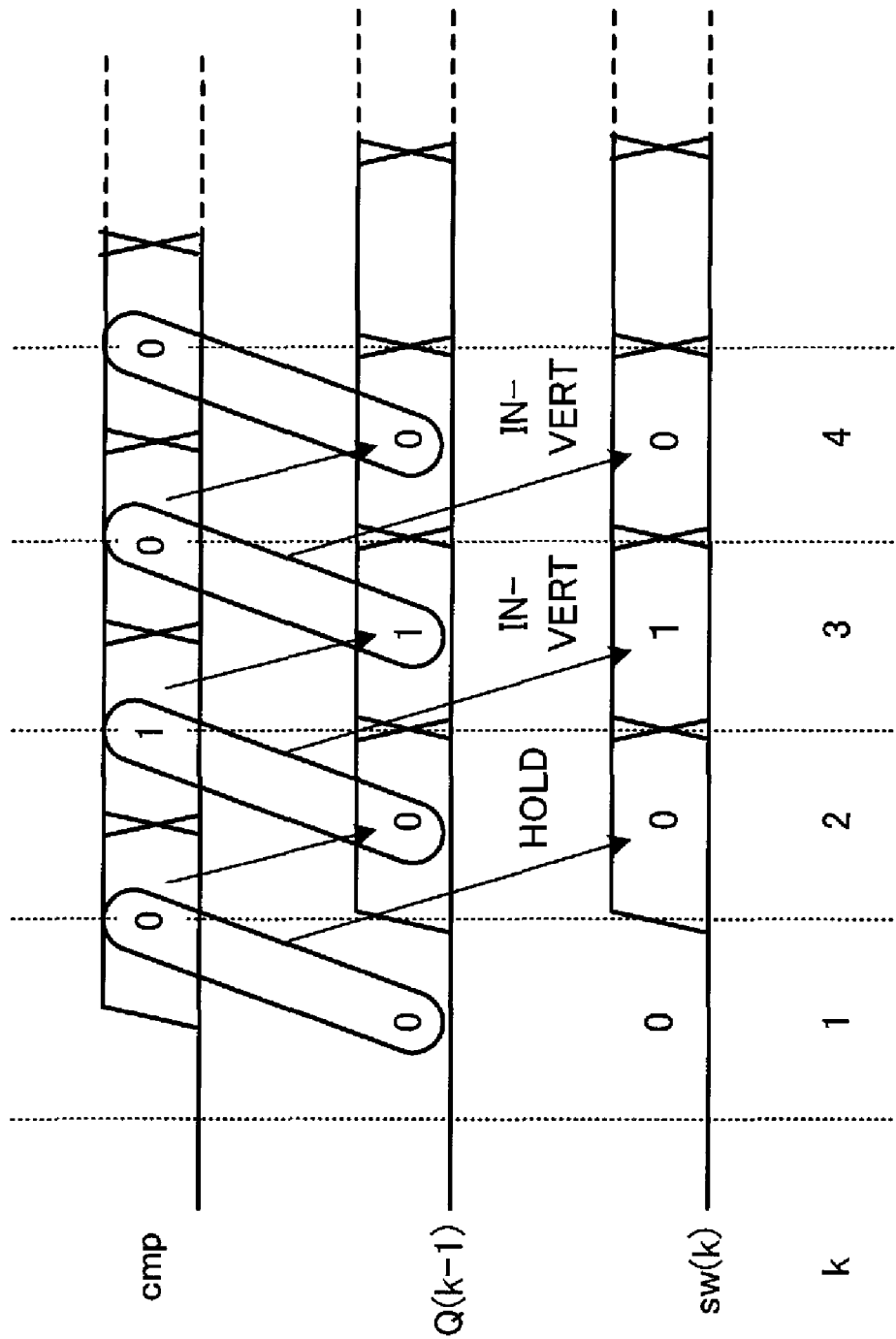
FIG. 9 is a time chart illustrating a relationship among a comparison result, a signal Q (k−1), and a signal sw (k)

FIG. 9 is a time chart illustrating a relationship among the comparison result, the signal Q (k-1), and the signal sw(k). The time chart of FIG. 9 illustrates this relationship using the above-described example of the operations of the input signal processor 12 in FIG. 8. As illustrated in FIG. 9, the signal state of the signal Q(k-1) changes based on the comparison result cmp. The signal sw(k) inverts and holds the previous signal state based on the present comparison result cmp and the signal state of the previous signal Q(k-1).

The signal Q(k-1) is the comparison result cmp latched by the D-FF circuit 15. Accordingly, the signal sw(k) inverts and holds the signal state based on the present comparison result cmp and the previous comparison result cmp as illustrated in FIG. 9.

Figure 10:
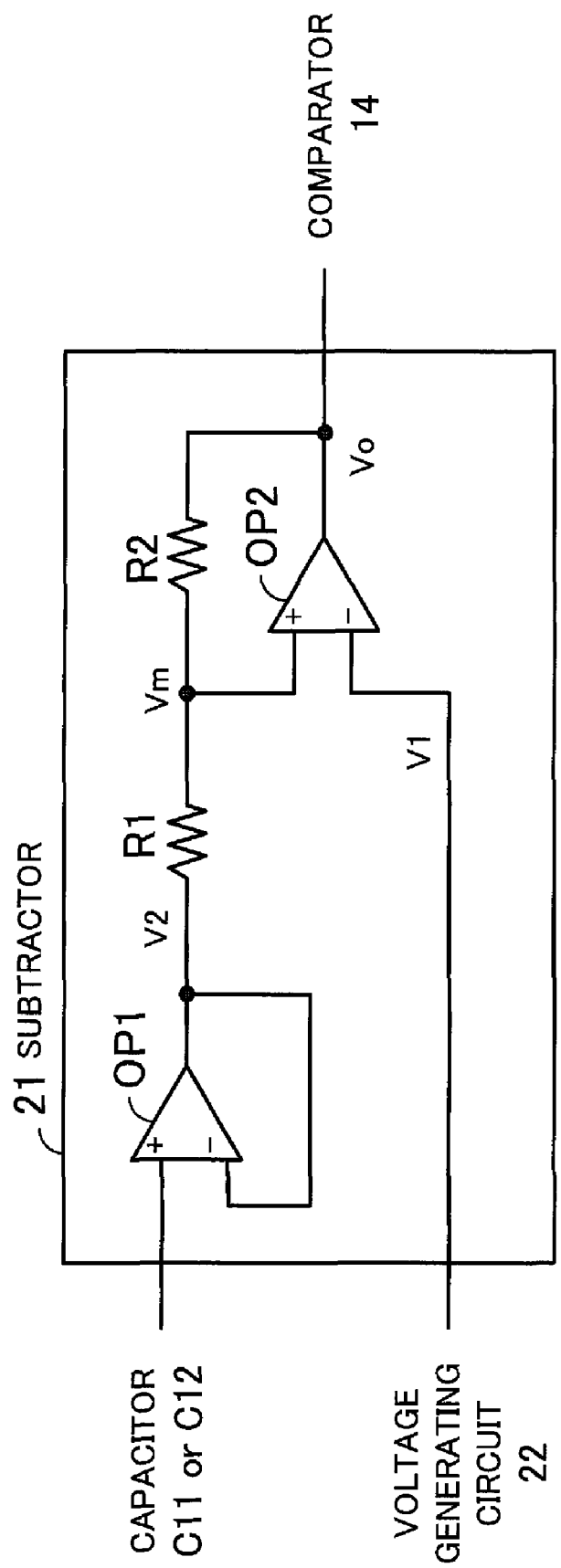
FIG. 10 is a circuit diagram of a subtractor in the input signal processor of FIG. 8.

FIG. 10 is a circuit diagram of the subtractor in the input signal processor 12 of FIG. 8. As illustrated in FIG. 10, the subtractor 21 has operational amplifiers OP1 and OP2, and resistors R1 and R2.

The operational amplifier OP1 receives a voltage of the capacitor C11 or C12 illustrated in FIG. 8. The operational amplifier OP1 forms a voltage follower, and supplies the incoming voltage to the resistor R1.

The operational amplifier OP2 forms a subtraction circuit together with the resistors R1 and R2. The output of the operational amplifier OP2 provides a voltage produced by subtracting an input voltage to a negative-phase input terminal of the operational amplifier OP2 from an input voltage to the resistor R1.

The input voltage to the negative-phase input terminal of the operational amplifier OP2 and the input voltage to the resistor R1 are denoted as V1 and V2, respectively. An output voltage of the operational amplifier OP2 is denoted as Vo. An input voltage to a positive-phase input terminal of the operational amplifier OP2 is denoted as Vm. A gain of the operational amplifier OP2 is denoted as G. Resistance values of the resistors R1 and R2 are denoted as R1 and R2, respectively. The output voltage Vo of the operational amplifier OP2 is represented by the following formula (14).

$$Vo = G(Vm - V1) \qquad (14)$$

The input voltage Vm to the positive-phase input terminal of the operational amplifier OP2 is represented by the following formula (15).

$$Vm = (VoR2 + V2R2)/(R1 + R2) \qquad (15)$$

Here, suppose that the subtraction circuit satisfies the conditions represented by the following formula (16).

$$\{GR2/(R1+R2)\} \gg 1 \qquad (16)$$

When the formula (15) is substituted into the formula (14) and the conditions represented by the formula (16) are applied to the resulting formula (14), the following formula (17) is obtained.

$$Vo = (V2 - V1) + R1V1/R2 \qquad (17)$$

Here, suppose that the subtraction circuit satisfies the conditions represented by the following formula (18).

$$R2 \gg R1 \qquad (18)$$

When the conditions represented by the formula (18) are applied to the formula (17), the following formula (19) is obtained.

$$Vo = V2 - V1 \qquad (19)$$

As represented by the formula (19), the subtractor 21 of FIG. 10 can provide a voltage produced by subtracting the voltage of the voltage generating circuit 22 from the voltage of the capacitor C11 or C12.

Figure 11:
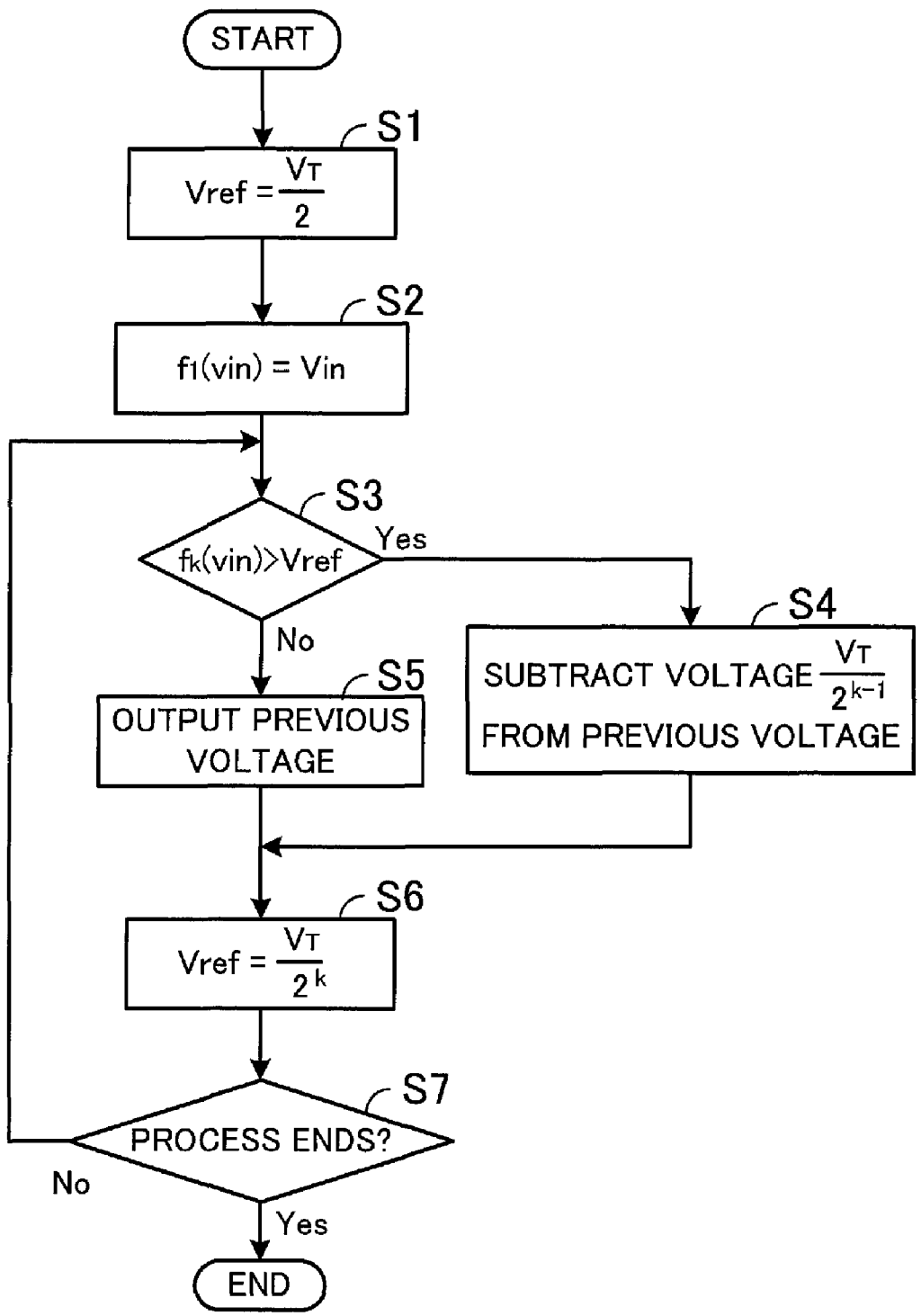
FIG. 11 is a flowchart illustrating operations of the ADC of FIG. 2.

FIG. 11 is a flowchart illustrating operations of the ADC of FIG. 2.

In step S1, the reference voltage source 13 supplies the reference voltage Vref=$V_T/2$(k=0) to the comparator 14.

In step S2, the input signal processor 12 supplies $f_1$(vin)=Vin (k=1, $f_0$(vin)=Vin, and Q(k-1)=0) to the comparator 14.

In step S3, the comparator 14 compares the voltage $f_k$(vin) from the input signal processor 12 and the voltage $V_T/2^k$ (Vref) from the reference voltage source 13. When the voltage $f_k$(vin) is higher than the voltage $V_T/2^k$, or in other words, when the ADC serially outputs a digital signal of the bit '1', the process goes to step S4. When the voltage $f_k$(vin) is lower than the voltage $V_T/2^k$, or in other words, when the ADC serially outputs a digital signal of the bit '0', the process goes to step S5.

In step S4, the input signal processor 12 increments the variable k by one, subtracts the voltage $V_T/2^{k-1}$ from the previous voltage $f_{k-1}$(vin) and supplies the voltage $f_k$(vin) to the comparator 14.

In step S5, the input signal processor 12 increments the variable k by one, and supplies the previous voltage $f_{k-1}$(vin) as the voltage $f_k$(vin) to the comparator 14.

In step S6, the reference voltage source 13 supplies the reference voltage Vref=$V_T/2^k$ to the comparator 14.

In step S7, the ADC determines whether to output the bit length of a serially output digital signal. If No, the process returns to step S3. If Yes, the process ends.

As described above, the input signal processor sets the input signal as an initial value, and sequentially subtracts each of the voltages $V_T/2$, $V_T/4$, $V_T/8$, . . . from the previously calculated voltage based on the comparison result from the comparator 14. The reference voltage source 13 reduces the reference voltage to be compared with the voltage output from the input signal processor 12 to $V_T/2$, $V_T/4$, $V_T/8$, . . . . This processing enables the input signal processor 12 and the reference voltage source 13 to be formed using, for example, circuits illustrated in FIGS. 7 and 8. Further, this processing enables the input signal processor 12 and the reference voltage source 13 to keep the number of capacitors constant regardless of the number of bits required for the A/D conversion. Therefore, this processing makes it possible to suppress increase in circuit density and to reduce power consumption.

Next, a second embodiment will be described in detail with reference to the accompanying drawings. The second embodiment is different from the first embodiment in the circuit of the input signal processor 12 illustrated in FIG. 2 and in the voltage generating circuit 22 and subtractor 21 of the input signal processor 12 illustrated in FIG. 8.

Figure 12:
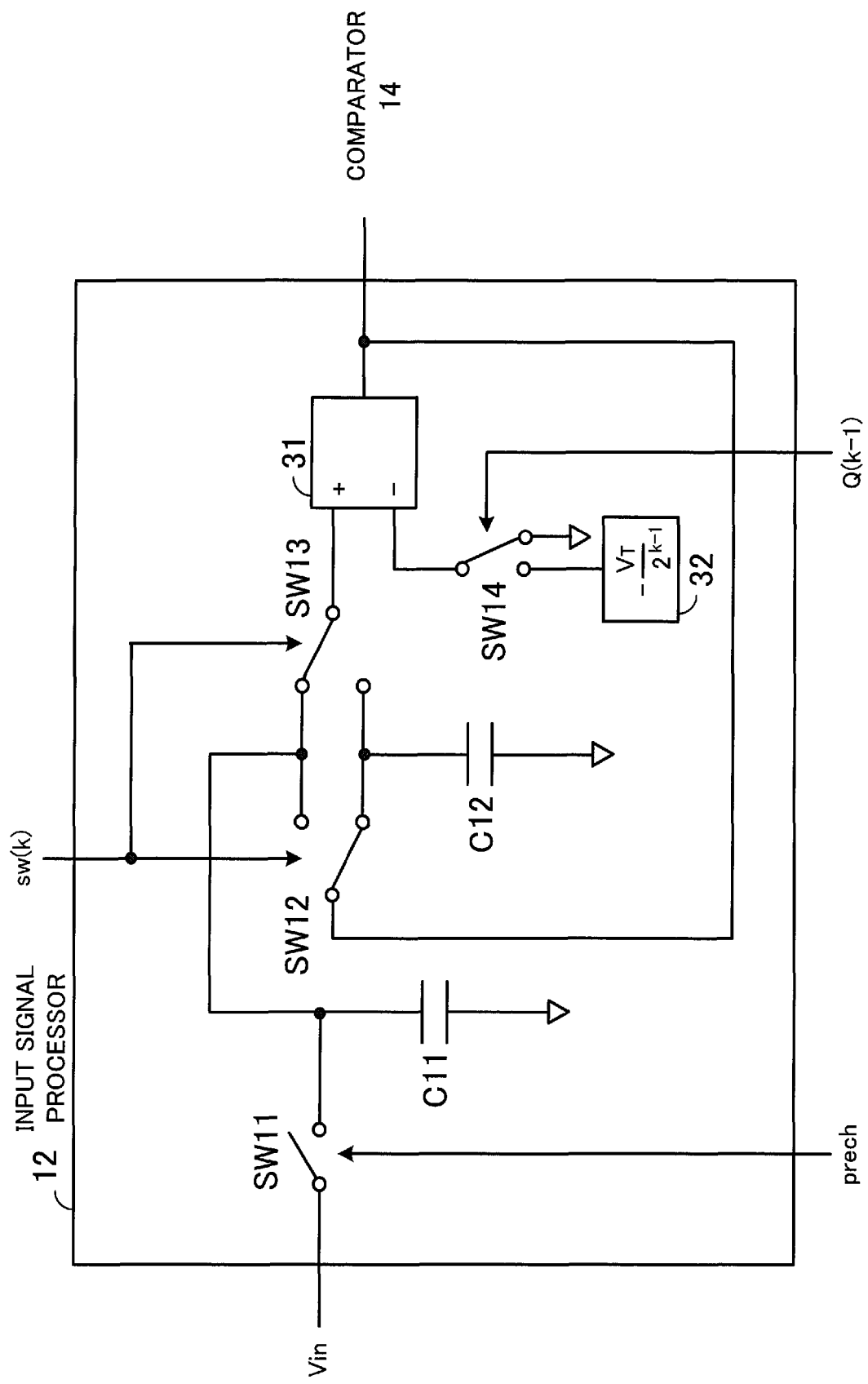
FIG. 12 is a circuit diagram of an input signal processor of an ADC according to a second embodiment of the invention.

FIG. 12 is a circuit diagram of an input signal processor of an ADC according to the second embodiment of the invention. In FIG. 12, the same circuit elements as those in FIG. 8 are indicated by the same reference numerals as in FIG. 8, and the description will not be repeated here.

As illustrated in FIG. 12, the input signal processor 12 has an adder 31 and a voltage generating circuit 32.

The adder 31 receives a voltage of the capacitor C11 or C12 and a voltage $-V_T/2^k$ of the voltage generating circuit 32. The adder 31 adds the voltage of the capacitor C11 or C12 and the voltage $-V_T/2^k$ from the voltage generating circuit 32, and supplies the resulting voltage to the comparator 14.

The voltage generating circuit 32 generates the voltage $-V_T/2^k$. The voltage $-V_T/2^k$ generated by the voltage generating circuit 32 is supplied to the adder 31 based on the signal Q(k−1).

In FIG. 8, the subtractor 21 subtracts the voltage $V_T/2^k$ from the voltage of the capacitor C11 or C12. In FIG. 12, the adder 31 adds the voltage $-V_T/2^k$ to the voltage of the capacitor C11 or C12. Accordingly, the output voltage of the adder 31 is the same as that of the subtractor 21, and the input signal processor 12 of FIG. 12 performs the same operations as those of the input signal processor 12 of FIG. 8.

Figure 13:
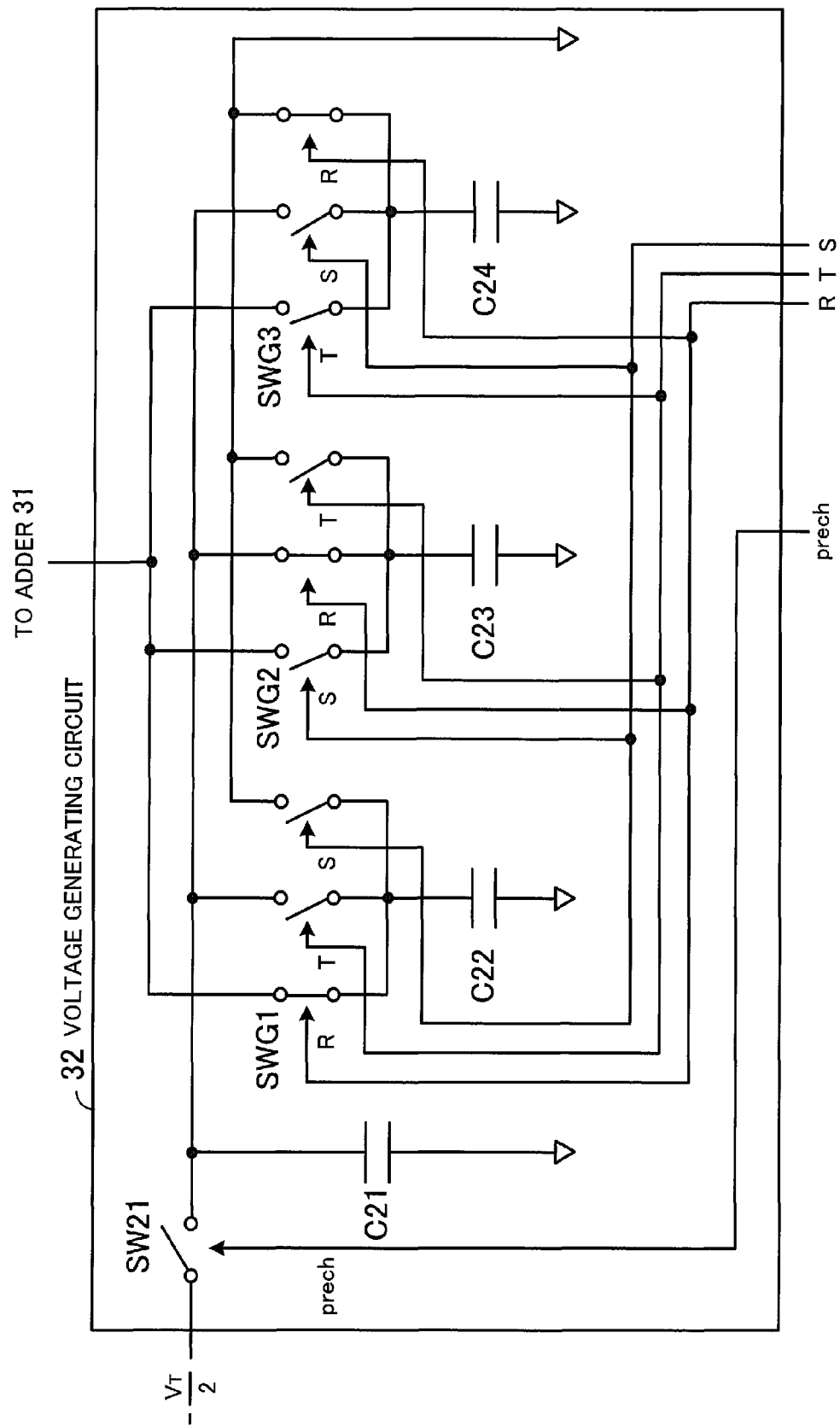
FIG. 13 is a circuit diagram of a voltage generating circuit of FIG. 12.

FIG. 13 is a circuit diagram of the voltage generating circuit 32 of FIG. 12. As illustrated in FIG. 13, the voltage generating circuit 32 has capacitors C21 to C24, a switch SW21, and switch groups SWG1 to SWG3. The voltage generating circuit 32 receives a voltage $-V_T/2$, a precharge signal prech, and signals R, S, and T.

The switch SW21 is turned on/off by the precharge signal prech. The precharge signal prech is supplied to the voltage generating circuit 32 before analog signals are converted into digital signals. When the switch SW21 is turned on, the capacitor C21 is precharged with a voltage $-V_T/2^k$.

Each of the switch groups SWG1 to SWG3 has three switches. The switch groups SWG1 to SWG3 are connected to each one end of the capacitors C22 to C24, respectively. The switch groups SWG1 to SWG3 connect each one end of the capacitors C22 to C24 to any one of the adder 31, the ground, and the capacitor C21 by the signals R, S, and T, respectively.

The switch groups SWG1 to SWG3 differentially connect each one end of the capacitors C22 to C24 to any one of the adder 31, the ground, and the capacitor C21, respectively. For example, when the switch group SWG1 is turned on so as to connect one end of the capacitor C22 to the adder 31, the switch group SWG2 connects one end of the capacitor C23 to the capacitor C21, and the switch group SWG3 connects one end of the capacitor C24 to the ground.

The signal R controls connections between one end of the capacitor C22 and the adder 31, between one end of the capacitor C23 and the capacitor C21, and between one end of the capacitor C24 and the ground. The signal S controls connections between one end of the capacitor C22 and the ground, between one end of the capacitor C23 and the adder 31, and between one end of the capacitor C24 and the capacitor C21. The signal T controls connections between one end of the capacitor C22 and the capacitor C21, between one end of the capacitor C23 and the ground, and between one end of the capacitor C24 and the adder 31.

The signals R, S, and T change such that when one signal takes, for example, a state '1', the other two signals take a state '0'. For example, in FIG. 13, when the signal R takes a state '1', the other two signals T and S take a state '0'. This enables each one end of the capacitors C22 to C23 to be differentially connected to any one of the capacitor C21, the adder 31, and the ground as described above.

Figure 14:
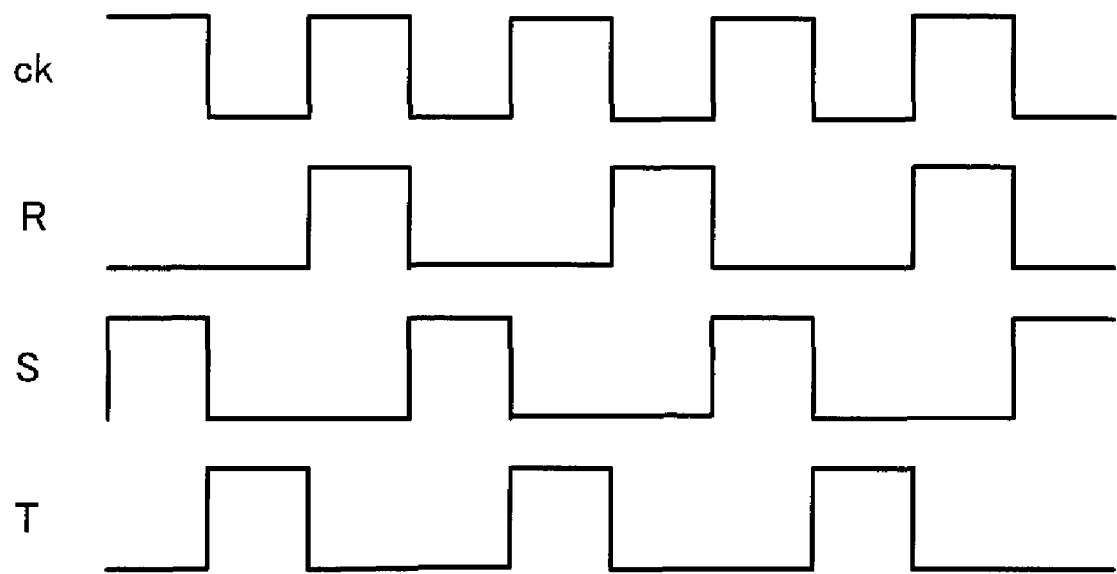
FIG. 14 is a timing chart of signals for switching switch groups of the voltage generating circuit of FIG. 13.

FIG. 14 is a timing chart of the signals R, S, and T for switching the switch groups SWG1 to SWG3 of the voltage generating circuit 32 of FIG. 13. As illustrated in FIG. 14, the signals R, S, and T change in synchronization with the clock signal ck. The signals R, S, and T change, for example, such that the signal state '1' appears sequentially as illustrated in FIG. 14. Accordingly, the signals R, S, and T change such that when one signal takes a state '1', the other two signals take a state '0'.

Figure 15:
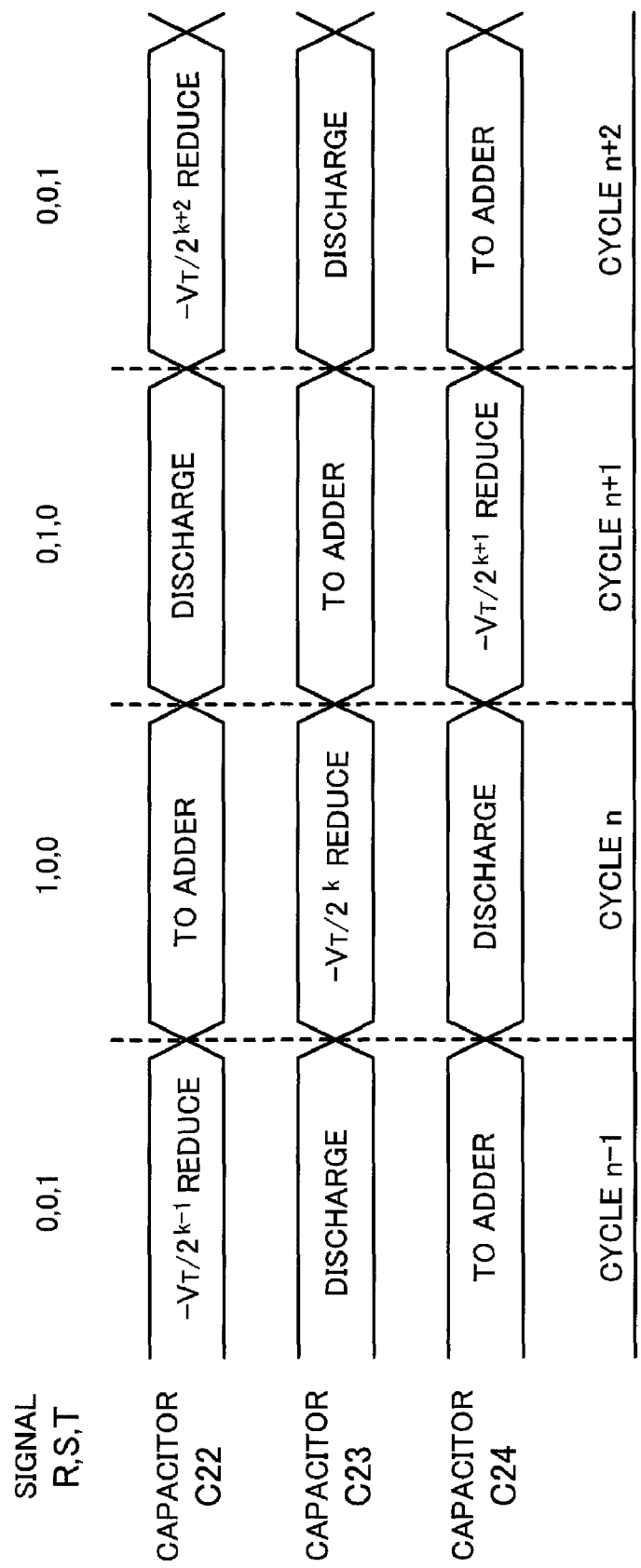
FIG. 15 illustrates operations of capacitors in the voltage generating circuit of FIG. 13.

FIG. 15 illustrates operations of the capacitors C22, C23, and C24 in the voltage generating circuit 32 of FIG. 13. More specifically, FIG. 15 illustrates operations of the capacitors C22, C23, and C24 during cycles of the clock signal ck are n−1, n, n+1, and n+2. Further, FIG. 15 illustrates the states 'x, y and z' of the signals R, S, and T during the cycles n−1, n, n+1, and n+2. The character x denotes a state of the signal R, the character y denotes a state of the signal S, and the character z denotes a state of the signal T.

In the example of FIG. 15, the signal state of the signal R is '1' during the cycle n. In this case, one end of the capacitor C22 is connected to the adder 31, and the voltage of the capacitor C22 is supplied to the adder 31. One end of the capacitor C23 is connected to the capacitor C21, and the capacitor C23 reduces a voltage held in the capacitor C21 to the voltage $-V_T/2^k$. One end of the capacitor C24 is connected to the ground, and the voltage of the capacitor C24 is discharged to the ground.

During the cycle n+1, the signal state of the signal S is '1'. In this case, one end of the capacitor C22 is connected to the ground, and the voltage of the capacitor C22 is discharged to the ground. One end of the capacitor C23 is connected to the adder 31, and the voltage of the capacitor C23 is supplied to the adder 31. One end of the capacitor C24 is connected to the capacitor C21, and the capacitor C24 reduces a voltage held in the capacitor C21 to the voltage $-V_T/2^{k+1}$.

During the cycle n+2, the signal state of the signal T is '1'. In this case, one end of the capacitor C22 is connected to the capacitor C21, and the capacitor C22 reduces a voltage held in the capacitor C21 to the voltage $-V_T/2^{k+2}$. One end of the capacitor C23 is connected to the ground, and the voltage of the capacitor C23 is discharged to the ground. One end of the capacitor C24 is connected to the adder 31, and the voltage of the capacitor C24 is supplied to the adder 31.

That is, each of the capacitors C22 to C24 illustrated in FIG. 13 repeatedly performs the voltage supply to the adder 31, the discharge, and the reduction of a voltage held in the capacitor C21.

Figure 16:
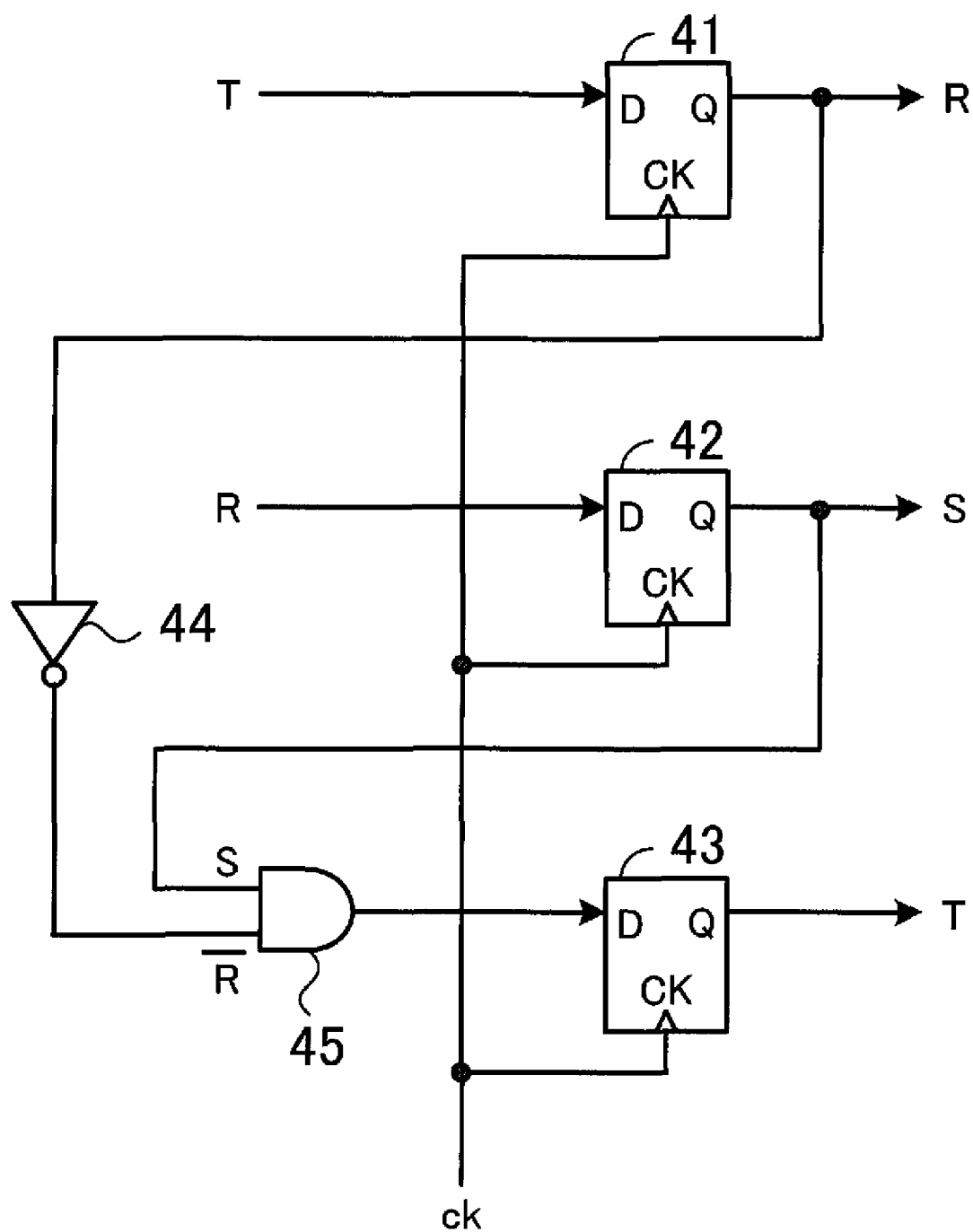
FIG. 16 illustrates a circuit for generating signals for switching switch groups in the voltage generating circuit of FIG. 13.

FIG. 16 illustrates a circuit for generating the signals R, S, and T for switching the switch groups SWG1 to SWG 3 of the voltage generating circuit 32 of FIG. 13. Each of clock signal terminals of D-FF circuits 41 to 43 illustrated in FIG. 16 receives the clock signal ck. The D terminal of the D-FF circuit 41 receives the signal T output from the D-FF circuit 43. The D terminal of the D-FF circuit 42 receives the signal R output from the D-FF circuit 41.

The signal R from the D-FF circuit 41 is inverted by the inverter circuit 44, and supplied to an AND circuit 45. The AND circuit 45 performs an AND operation between an inverted signal $\overline{R}$ of the signal R inverted by the inverter circuit 44 and the signal S output from the D-FF circuit 42, and supplies the operation result to the D-FF circuit 43. This circuit makes it possible to generate the signals R, S, and T as illustrated in FIG. 14.

Figure 17:
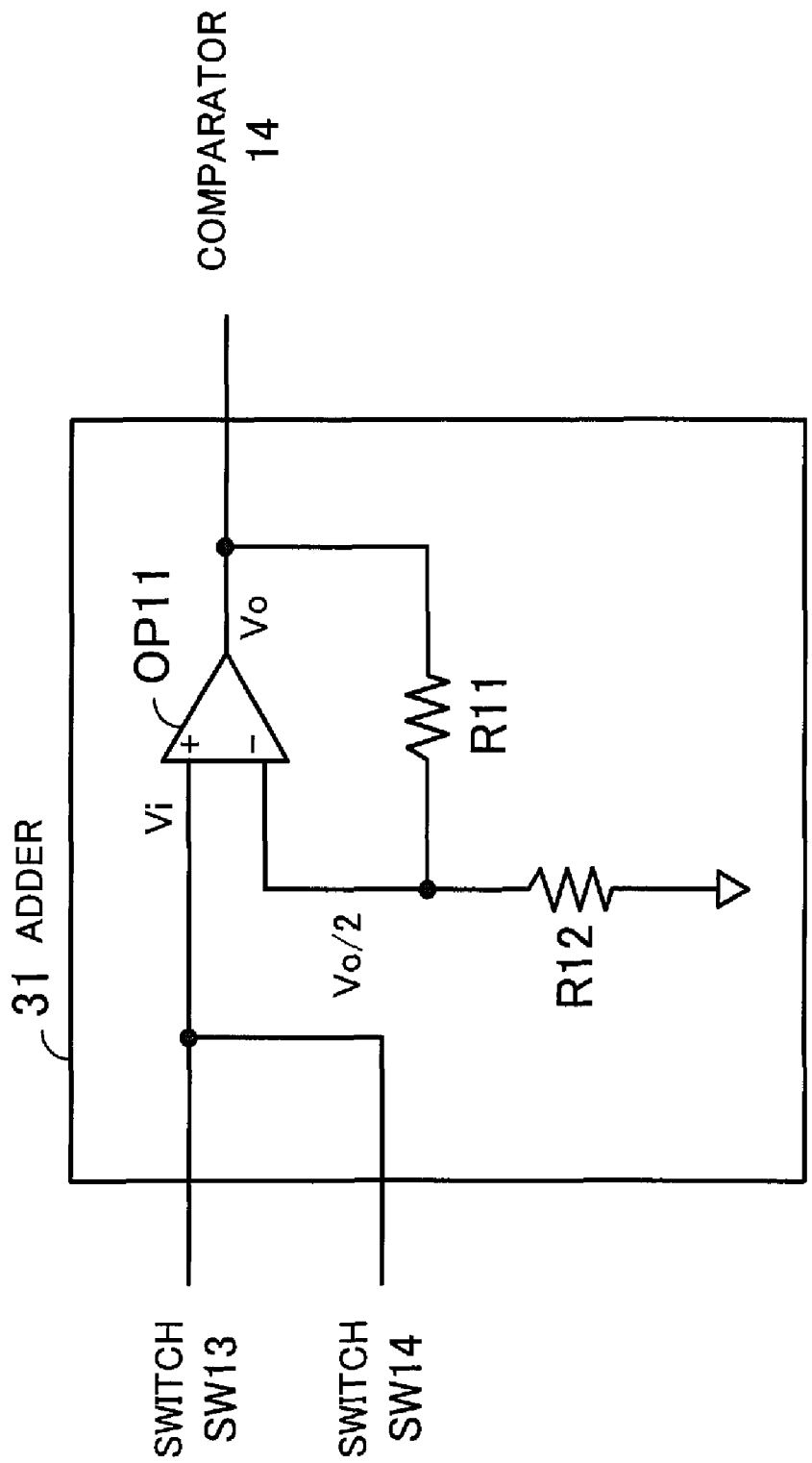
FIG. 17 is a circuit diagram of an adder of FIG. 12.

FIG. 17 is a circuit diagram of the adder 31 of FIG. 12. As illustrated in FIG. 17, the adder 31 has an operational amplifier OP11 and resistors R11 and R12.

A positive-phase input terminal of the operational amplifier OP11 is connected to the switches SW13 and SW14. The switches SW13 and SW14 are connected in a wired-OR structure to allow a current to intentionally flow between the switches SW13 and SW14. Accordingly, an input voltage Vi to the operational amplifier OP11 is an average of a voltage from the switch SW13 and a voltage from the switch SW14. For example, when the voltage from the switch SW13 is denoted as a voltage V1 and the voltage from the switch SW14 is denoted as a voltage V2, the input voltage V1 to the operational amplifier OP11 is represented by the following formula (20).

$$Vi=(V1+V2)/2 \quad (20)$$

When the switch SW14 is turned on, the voltage V2 is a voltage $-V_T/2^k$. Accordingly, the formula (20) is modified to the formula (21).

$$Vi=(V1-V_T/2^k)/2 \quad (21)$$

As represented by the formula (21), the positive-phase input terminal of the operational amplifier OP11 receives half of a voltage produced by adding the voltage $-V_T/2^k$ to the voltage held in the capacitor C11 or C12.

The circuit including the operational amplifier OP11 and the resistors R11 and R12 is a circuit for doubling and outputting the supply voltage. Accordingly, the adder 31 provides a result obtained by adding the voltage $-V_T/2^k$ (when the switch SW14 is turned on) to the voltage held in the capacitor C11 or C12.

Here, when the resistors R11 and R12 have the same resistance value and the output voltage of the operational amplifier OP11 is denoted as a voltage Vo, the input voltage to the negative-phase input terminal of the operational amplifier OP11 is denoted as a voltage Vo/2. Further, when the gain of the operational amplifier OP11 is denoted as G, the following formula (22) holds.

$$G(Vi-Vo/2)=Vo \quad (22)$$

When G>>2 holds in the formula (22), the formula (22) is modified to the formula (23).

$$Vo=2Vi \quad (23)$$

When the formula (21) is substituted in the formula (23), the following formula (24) is obtained.

$$Vo=V1-V_T/2^k \quad (24)$$

Thus, the adder 31 provides a result obtained by adding the voltage $-V_T/2^k$ to the voltage held in the capacitor C11 or C12.

Figure 18:
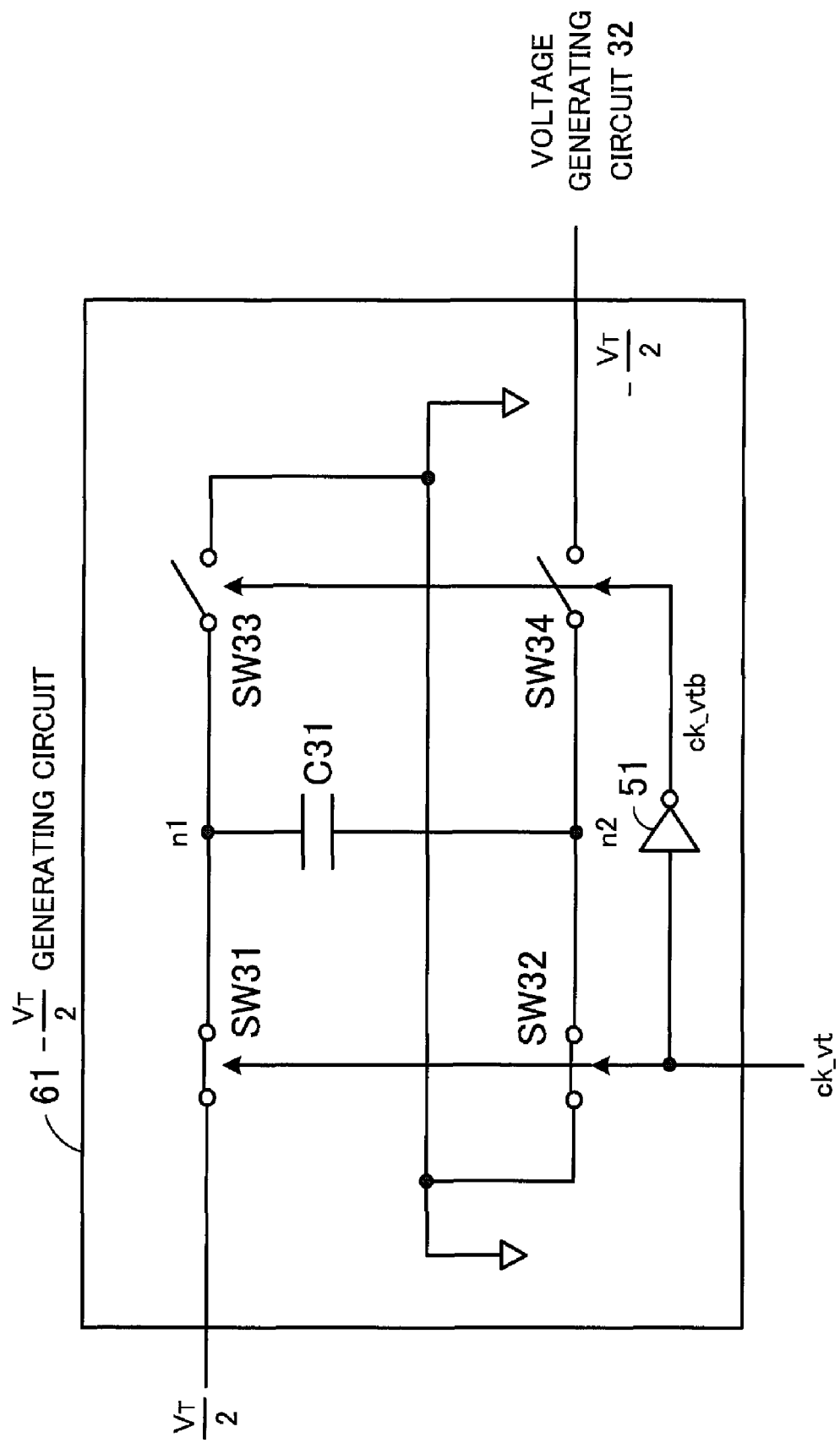
FIG. 18 is a circuit diagram of a circuit for generating a voltage $-V_T/2$ illustrated in FIG. 13.

FIG. 18 is a circuit diagram of a circuit for generating the voltage $-V_T/2$ illustrated in FIG. 13. As illustrated in FIG. 18, a $-V_T/2$ generating circuit 61 has switches SW31 to SW34, a capacitor C31, and an inverter circuit 51. The $-V_T/2$ generating circuit 61 receives a positive voltage $V_T/2$ and a signal ck_vt. The $-V_T/2$ generating circuit 61 generates a negative voltage $-V_T/2$ from the incoming positive voltage $V_T/2$, and supplies the negative voltage $-V_T/2$ to the voltage generating circuit 32 illustrated in FIG. 13.

The switches SW31 and SW32 are simultaneously turned on/off in an interlocked fashion, based on the signal ck_vt. The switches SW33 and SW34 are simultaneously turned on/off in an interlocked fashion, based on an inverted signal ck_vtb of the signal ck_vt inverted by the inverter circuit 51. Accordingly, when the switches SW31 and SW32 are turned on, the switches SW33 and SW34 are turned off, whereas when the switches SW31 and SW32 are turned off, the switches SW33 and SW34 are turned on.

When the switches SW31 and SW32 are turned on, the voltage $V_T/2$ is supplied to one end of the capacitor C31 and the other end of the capacitor C31 is connected to the ground. When the switches SW33 and SW34 are turned on, one end of the capacitor C31 is connected to the ground and the other end of the capacitor C31 is connected to the voltage generating circuit 32.

Figure 19:
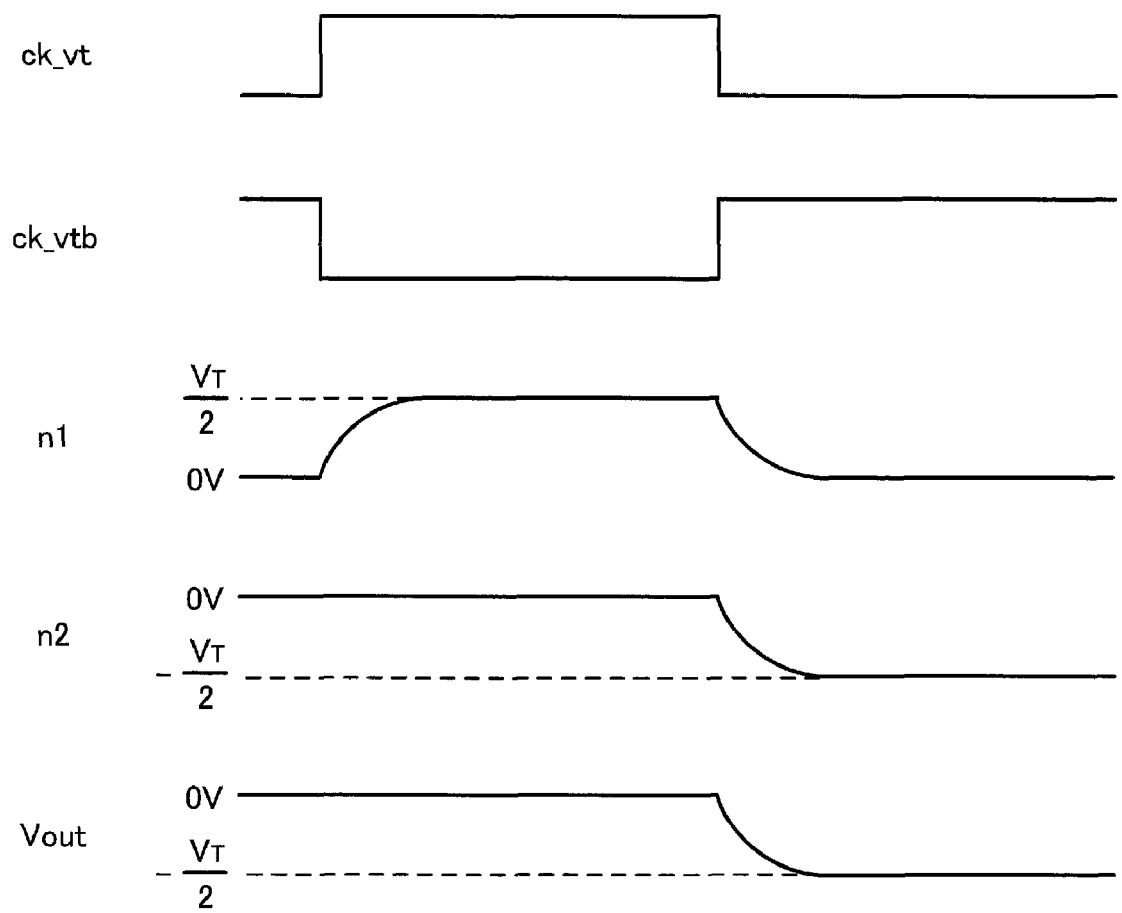
FIG. 19 is a timing chart illustrating operations of the circuit illustrated in FIG. 18.

FIG. 19 is a timing chart illustrating operations of the $-V_T/2$ generating circuit 61 illustrated in FIG. 18. FIG. 19 illustrates changes of the signal ck_vt, the signal ck_vtb, the voltages at the nodes n1 and n2 of the $-V_T/2$ generating circuit 61 illustrated in FIG. 18, and the voltage Vout supplied to the voltage generating circuit 32.

Suppose that the signal ck_vt changes from '0' to '1' as illustrated in FIG. 19. In this case, the inverted signal ck_vtb of the signal ck_vt inverted by the inverter circuit 51 changes from '1' to '0' as illustrated in FIG. 19. Based on this, since the switches SW31 and SW32 are turned on and the switches SW33 and SW34 are turned off, the voltage $V_T/2$ is supplied to a terminal on the node n1 side of the capacitor C31, and a terminal on the node n2 side of the capacitor C31 is connected to the ground. As a result, the voltages at the nodes n1 and n2 of the $-V_T/2$ generating circuit 61 illustrated in FIG. 18 change as illustrated in FIG. 19.

Suppose that the signal ck_vt changes from '1' to '0' as illustrated in FIG. 19. In this case, the inverted signal ck_vtb of the signal ck_vt inverted by the inverter circuit 51 changes from '0' to '1' as illustrated in FIG. 19. Based on this, since the switches SW31 and SW32 are turned off and the switches SW33 and SW34 are turned on, a voltage at the node n1 of the capacitor C31 goes to '0' and a voltage at the node n2 of the capacitor C31 goes to '$-V_T/2$'. As a result, the voltages at the nodes n1 and n2 of the $-V_T/2$ generating circuit 61 illustrated in FIG. 18 change as illustrated in FIG. 19. Thus, the voltage $-V_T/2$ is generated and supplied to the voltage generating circuit 32.

The following will hereinafter describe a comparison among an ADC for generating a reference voltage that is a combination of $1/n$, $2/n$, ..., $(n-1)/n$ (n is the output bit number of the ADC) of the voltage $V_T$ and performing an analog-to-digital conversion, and the ADCs according to the first and second embodiments.

FIG. 20 illustrates the comparison among the ADCs. In FIG. 20, the character A denotes the ADC for generating a reference voltage that is a combination of $1/n$, $2/n$, ..., $(n-1)/n$ of the voltage $V_T$ and performing an analog-to-digital conversion. The letter B denotes the ADC according to the first embodiment. The letter C denotes the ADC according to the second embodiment. Hereinafter, the respective ADCs may be denoted as an ADC 'A', an ADC 'B', and an ADC 'C'.

FIG. 20 illustrates examples of data formats, input loads, areas, time constants, and power consumption of the respective ADCs. The respective ADCs use a n-bit serial data format as illustrated in FIG. 20.

The respective ADCs have an input load on one capacitor and operational amplifiers. For example, since the input signal Vin is supplied to one of the capacitors C11 and C12 and the subtractor 21 as illustrated in FIG. 8, the ADC 'B' has an input load as illustrated in FIG. 20. The same concept can also be applied to the ADC 'C'.

The ADC 'A' generates the reference voltage that is a combination of $1/n$, $2/n$, ..., $(n-1)/n$ (n is the output bit number of the ADC) of the voltage VT as described above. Therefore, the ADC 'A' has one to $2^{n-1}$ capacitors. The ADC 'A' has an area of about $(2^n+1)C$.

The ADC 'B' has three capacitors illustrated in FIG. 7, three capacitors of the voltage generating circuit illustrated in FIG. 8, two capacitors illustrated in FIG. 8, and two operational amplifiers and two resistors illustrated in FIG. 10. The ADC 'B' has an area of 8C+2R+2OP in total.

The ADC 'C' has three capacitors illustrated in FIG. 7 (the ADC 'C' has the reference voltage source 13 illustrated in FIG. 2), two capacitors illustrated in FIG. 12, four capacitors of the voltage generating circuit 32 illustrated in FIG. 13, one operational amplifier and two resistors illustrated in FIG. 17, and one capacitor illustrated in FIG. 18. The ADC 'C' has an area of 10C+2R+1OP in total.

When a resistance value of a switch for charging or discharging a capacitor is denoted as Rs, the respective ADCs 'A' to 'C' have a time constant as illustrated in FIG. 20. The ADCs 'B' and 'C' have a smaller number of capacitors than that of the ADC 'A', and therefore, have a reduced time constant. When a supply voltage is denoted as V and a sampling frequency is denoted as f, the respective ADCs 'A' to 'C' have power consumption as illustrated in FIG. 20.

Figure 21:
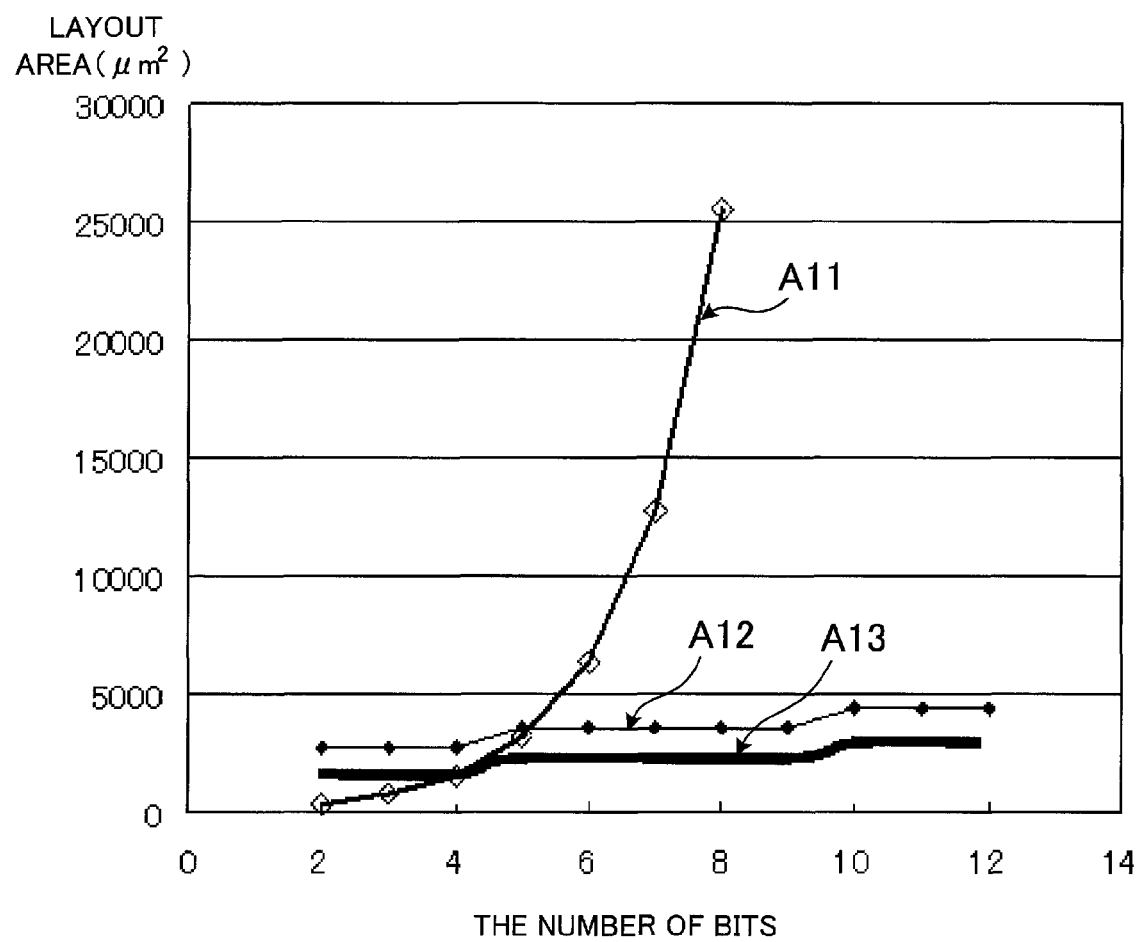
FIG. 21 illustrates a relationship between the number of bits and layout area among ADCs.

FIG. 21 illustrates a relationship between the number of bits and layout area among ADCs. In each of graphs in FIG. 21, the horizontal axis represents the number of bits of ADCs, and the vertical axis represents the layout area of ADCs. A graph indicated by an arrow A11 in FIG. 21 represents a relationship between the number of bits and layout area of the ADC 'A'. A graph indicated by an arrow A12 in FIG. 21 represents a relationship between the number of bits and layout area of the ADC 'B'. A graph indicated by an arrow A13 in FIG. 21 represents a relationship between the number of bits and layout area of the ADC 'C'.

The ADCs 'B' and 'C' have an operational amplifier. FIG. 21 illustrates the layout area on the assumption that a 4-bit or less ADC has an operational amplifier with a two-stage differential amplifier circuit, a 5 to 9-bit ADC has an operational amplifier with a three-stage differential amplifier circuit, and a 10-bit or more ADC has an operational amplifier with a four-stage differential amplifier circuit.

In the case of a 6-bit or more ADC, the ADC 'B' has a layout area smaller than that of the ADC 'A' as indicated by arrows A11 and A12. In the case of a 5-bit or more ADC, the ADC 'C' has a layout area smaller than that of the ADC 'A' as indicated by arrows A11 and A13.

Figure 22:
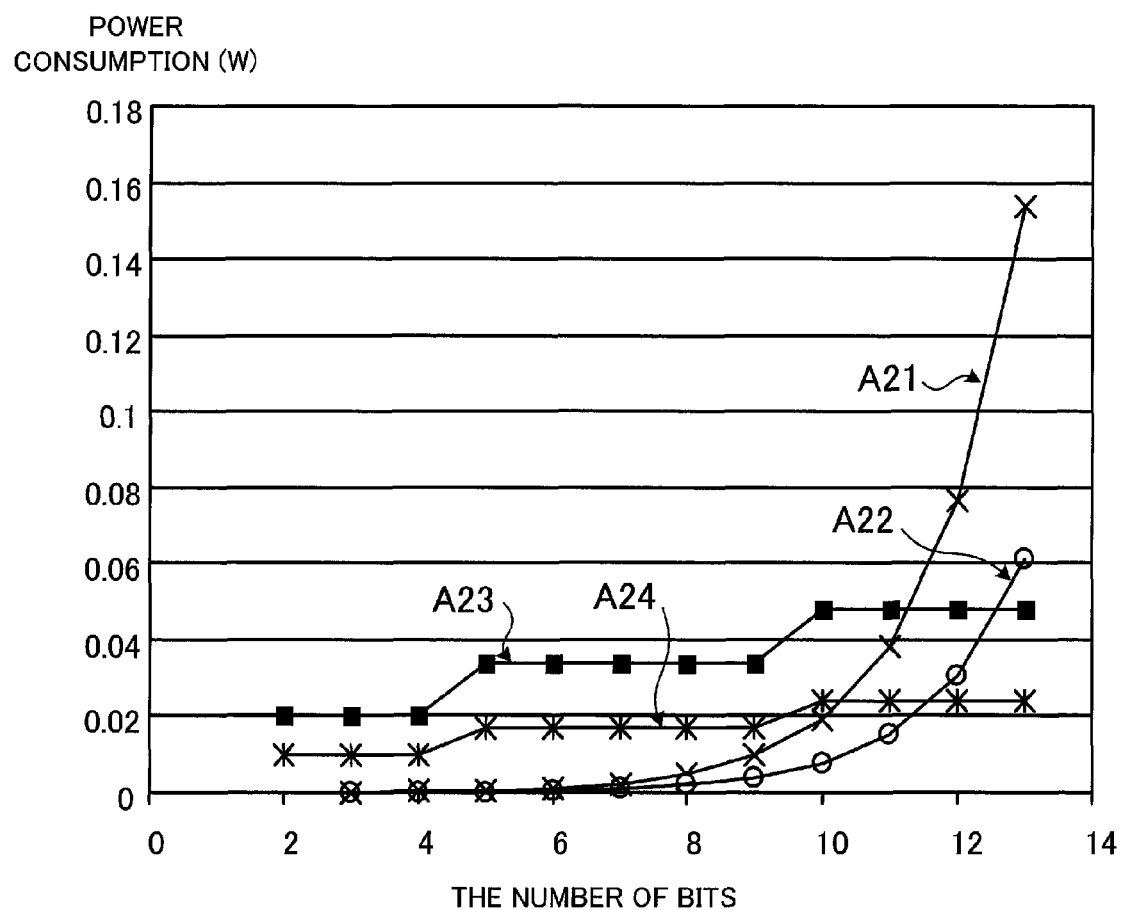
FIG. 22 illustrates a relationship between the number of bits and power consumption among ADCs.

FIG. 22 illustrates a relationship between the number of bits and power consumption among ADCs. In each of graphs in FIG. 22, the horizontal axis represents the number of bits of ADCs, and the vertical axis represents the power consumption of ADCs. A graph indicated by an arrow A21 in FIG. 21 represents a relationship between the number of bits and power consumption of the ADC 'A' at an operating frequency of 250 MHz. A graph indicated by an arrow A22 in FIG. 21 represents a relationship between the number of bits and power consumption of the ADC 'A' at an operating frequency of 100 MHz. A graph indicated by an arrow A23 in FIG. 21 represents a relationship between the number of bits and power consumption of the ADC 'B'. A graph indicated by an arrow A24 in FIG. 21 represents a relationship between the number of bits and power consumption of the ADC 'C'.

The ADCs 'B' and 'C' have an operational amplifier. FIG. 22 illustrates the power consumption calculated on the assumption that a 4-bit or less ADC has an operational amplifier with a two-stage differential amplifier circuit whose power consumption is 5 mA, a 5 to 9-bit ADC has an operational amplifier with a two-stage differential amplifier circuit whose power consumption is 5 mA and with a one-stage differential amplifier circuit whose power consumption is 7 mA, and a 10-bit or more ADC has an operational amplifier with a two-stage differential amplifier circuit whose power consumption is 5 mA and with a two-stage differential amplifier circuit whose power consumption is 7 mA. The ADCs 'B' and 'C' have almost the same power consumption at any operating frequencies of 250 MHz and 100 MHz.

The following will describe the relationship between the number of bits and power consumption among the ADCs at the operating frequency of 250 MHz. In the case of a 12-bit or more ADC, the ADC 'B' has power consumption smaller than that of the ADC 'A' as indicated by arrows A21 and A23. In the case of a 11-bit or more ADC, the ADC 'C' has power consumption smaller than that of the ADC 'A' as indicated by arrows A21 and A24.

The following will describe the relationship between the number of bits and power consumption among the ADCs at the operating frequency of 100 MHz. In the case of a 13-bit or more ADC, the ADC 'B' has power consumption smaller than that of the ADC 'A' as indicated by arrows A22 and A23. In the case of a 12-bit or more ADC, the ADC 'C' has power consumption smaller than that of the ADC 'A' as indicated by arrows A22 and A24.

As described above, the input signal processor sets the input signal as an initial value, and sequentially adds each of the voltages $-V_T/2$, $-V_T/4$, $-V_T/8$, ... to the previously calculated voltage based on the comparison result from the comparator 14. The reference voltage source 13 reduces the reference voltage to be compared with the voltage output from the input signal processor 12 to $V_T/2$, $V_T/4$, $V_T/8$, .... This processing enables the input signal processor 12, the voltage generating circuit 32, and the reference voltage source 13 to be formed using, for example, circuits illustrated in FIGS. 12, 13 and 7. Further, this processing enables the input signal processor 12, the voltage generating circuit 32, and the reference voltage source 13 to keep the number of capacitors constant regardless of the number of bits required for the A/D conversion. Therefore, this processing makes it possible to suppress increase in circuit density and to reduce power consumption.

Next, a third embodiment will be described in detail with reference to the accompanying drawings. According to the first embodiment, the reference voltage source 13 and the voltage generating circuit 22 of the input signal processor 12 are provided as separate circuits. The same concept can also be applied to the second embodiment. According to the third embodiment, the reference voltage source and the voltage generating circuit are formed as a common circuit.

Figure 23:
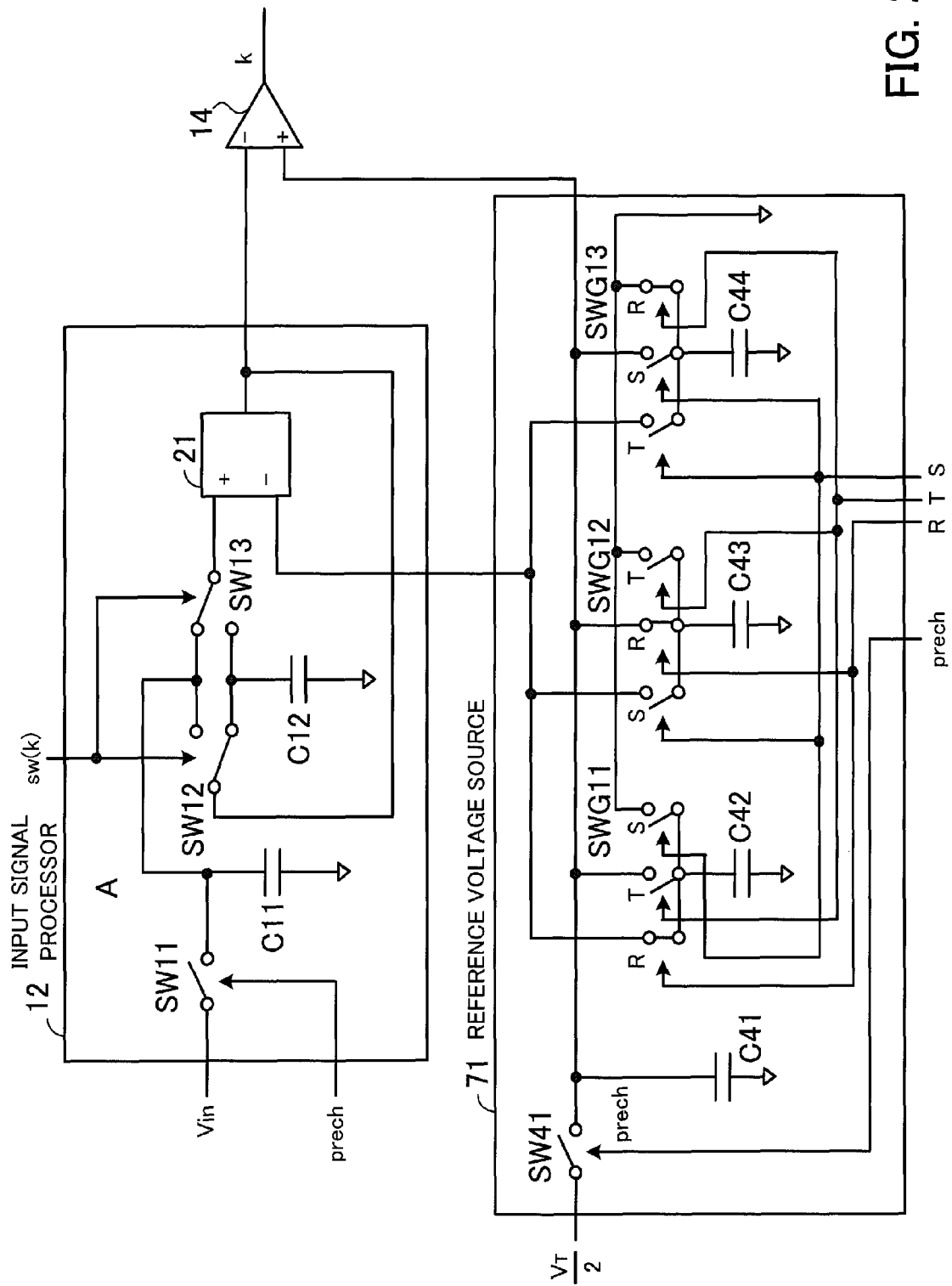
FIG. 23 is a circuit diagram of an ADC according to a third embodiment of the invention.

FIG. 23 is a circuit diagram of an ADC according to the third embodiment of the invention. As illustrated in FIG. 23, the ADC has the input signal processor 12, a reference voltage source 71, and the comparator 14. In the input signal processor 12 of FIG. 23, the same circuit elements as those in the input signal processor 12 of FIG. 8 are indicated by the same reference numerals as in FIG. 8, and the description will not be repeated here. In the input signal processor 12 illustrated in FIG. 23, the subtractor 21 receives a voltage $V_T/2^{k-1}$ from the reference voltage source 71. Operations of the input signal processor 12 illustrated in FIG. 23 are the same as those of the input signal processor 12 illustrated in FIG. 8.

The reference voltage source 71 has capacitors C41 to C44, a switch SW41, and switch groups SWG11 to SWG13. The reference voltage source 71 receives a voltage $V_T/2$, a precharge signal prech, and signals R, S, and T.

The reference voltage source 71 performs the same operations as those of the voltage generating circuit illustrated in FIG. 13. Note, however, that the reference voltage source 71 is different from the voltage generating circuit 32 in that the incoming voltage is the voltage $V_T/2$.

According to the third embodiment, a voltage generated by the reference voltage source 71 is supplied to the subtractor 21 and the comparator 14. This makes it possible to suppress increase in the circuit area of the ADC. For example, the circuit illustrated in FIG. 23 has six capacitors.

The above-described analog-to-digital converter and analog-to-digital conversion method make it possible to suppress increase in the circuit area.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that various changes, substitutions and alterations could be made hereto without departing from the spirit and scope of the invention.

What is claimed is:

1. An analog-to-digital converter for digitally converting an analog input signal, comprising:
   an input signal processor which sets a voltage of the input signal as an initial value of a signal voltage, subtracts $\frac{1}{2}^n$ of an input range from the nth (n is a positive integer) signal voltage based on a comparison result, and outputs the (n+1)th signal voltage; and
   a reference voltage source which outputs a reference voltage to be compared with the signal voltage output from the input signal processor, the reference voltage being obtained by repeatedly reducing by one half the input range.

2. The analog-to-digital converter according to claim 1, wherein:
   the input signal processor comprises:
   two capacitive elements; and
   a subtractor which subtracts $\frac{1}{2}^n$ of the input range from the nth signal voltage held in one of the capacitive elements, outputs the (n+1)th signal voltage, and holds the output signal voltage in the other capacitive element.

3. The analog-to-digital converter according to claim 2, wherein:
   the subtractor has two operational amplifiers and two resistors.

4. The analog-to-digital converter according to claim 1, wherein:
   the input signal processor further comprises:
   an input switch which switches connection between the two capacitive elements and the input of the subtractor; and
   an output switch which switches connection between the two capacitive elements and the output of the subtractor.

5. The analog-to-digital converter according to claim 1, further comprising:
   a comparator which compares the signal voltage from the input signal processor with the reference voltage from the reference voltage source, and outputs the comparison result.

6. The analog-to-digital converter according to claim 1, further comprising:
   a signal circuit which inverts the previous signal state and outputs the inverted signal state when the present comparison result is determined such that the signal voltage is higher than the reference voltage or when the present comparison result is determined such that the signal voltage is lower than the reference voltage and the previous comparison result is determined such that the signal voltage is higher than the reference voltage.

7. The analog-to-digital converter according to claim 6, wherein:
   based on the signal state output from the signal circuit, one of the capacitive elements is connected to the input of the subtractor, and the other capacitive element is connected to the output of the subtractor.

8. The analog-to-digital converter according to claim 1, wherein:
   the reference voltage source comprises:
   an input capacitive element which holds a half of the input range; and
   two voltage reducing elements which hold the reference voltage and in which when one of the voltage reducing elements is connected to the input capacitive element, the other voltage reducing element is discharged.

9. The analog-to-digital converter according to claim 1, wherein:
   the input signal processor comprises:
   two capacitive elements; and
   an adder which adds $\frac{1}{2}^n$ of the negative input range to the nth signal voltage held in one of the capacitive elements, and outputs the (n+1)th signal voltage.

10. The analog-to-digital converter according to claim 9, wherein:
    the adder has one operational amplifier and two resistors.

11. The analog-to-digital converter according to claim 1, wherein:
    the reference voltage source comprises:
    an input capacitive element which holds a half of the input range; and three voltage reducing elements which reduce the voltage of the input capacitive element, supply the reduced voltage as the reference voltage to the comparator as well as output the reduced voltage to the input signal processor, and discharge the reduced voltage.

12. An analog-to-digital conversion method of an analog-to-digital converter for digitally converting an analog input signal, comprising:

causing an input signal processor to set a voltage of the input signal as an initial value of a signal voltage, to subtract $½^n$ of an input range from the nth (n is a positive integer) signal voltage based on a comparison result, and to output the (n+1)th signal voltage; and causing a reference voltage source to output a reference voltage to be compared with the signal voltage, the reference voltage being obtained by repeatedly reducing by one half the input range.

\* \* \* \* \*